(12) United States Patent
Yoshida et al.

(10) Patent No.: US 11,901,173 B2
(45) Date of Patent: *Feb. 13, 2024

(54) SUBSTRATE PROCESSING METHOD

(71) Applicant: SCREEN Holdings Co., Ltd., Kyoto (JP)

(72) Inventors: Yukifumi Yoshida, Kyoto (JP); Manabu Okutani, Kyoto (JP); Shuichi Yasuda, Kyoto (JP); Yasunori Kanematsu, Kyoto (JP); Dai Ueda, Kyoto (JP); Song Zhang, Kyoto (JP); Tatsuro Nagahara, Kakegawa (JP); Takafumi Kinuta, Kakegawa (JP)

(73) Assignee: SCREEN Holdings Co., Ltd.

( * ) Notice: Subject to any disclaimer, the term of this patent is extended or adjusted under 35 U.S.C. 154(b) by 0 days.

This patent is subject to a terminal disclaimer.

(21) Appl. No.: 17/527,215

(22) Filed: Nov. 16, 2021

(65) Prior Publication Data
US 2022/0076941 A1 Mar. 10, 2022

Related U.S. Application Data

(63) Continuation of application No. 16/426,119, filed on May 30, 2019, now Pat. No. 11,211,241.

(30) Foreign Application Priority Data

May 31, 2018 (JP) .................. 2018-105632
Dec. 14, 2018 (JP) .................. 2018-234735

(51) Int. Cl.
*H01L 21/02* (2006.01)
*B08B 3/08* (2006.01)

(52) U.S. Cl.
CPC .......... *H01L 21/02057* (2013.01); *B08B 3/08* (2013.01)

(58) Field of Classification Search
CPC .......... H01L 21/02057; H01L 21/6715; H01L 21/67017; H01L 21/67051; H01L 21/67028; H01L 21/02041; B08B 3/08
(Continued)

(56) References Cited

U.S. PATENT DOCUMENTS 9,953,826 B2    4/2018  Kaneko et al.
10,272,478 B2   4/2019  Aibara et al.
(Continued)

FOREIGN PATENT DOCUMENTS

CN    102150085 A     8/2011
JP    H09-232302 A    9/1997
(Continued)

OTHER PUBLICATIONS

Extended European Search Report dated Oct. 23, 2019 in connection with corresponding European Patent Application No. 19176693.0.

*Primary Examiner* — Duy Vu N Deo
*Assistant Examiner* — Christopher Remavege
(74) *Attorney, Agent, or Firm* — OSTROLENK FABER LLP

(57) ABSTRACT

A substrate processing method includes a processing liquid supplying step of supplying a processing liquid to a patterned surface of a substrate having the patterned surface with projections and recesses, a processing film forming step of solidifying or curing the processing liquid supplied to the patterned surface to form, so as to follow the projections and the recesses of the patterned surface, a processing film which holds a removal object present on the patterned surface and a removing step of supplying a peeling liquid to the patterned surface to peel the processing film from the patterned surface together with the removal object, thereby removing
(Continued)

the processing film from the substrate, while such a state is kept that the removal object is held by the processing film.

15 Claims, 11 Drawing Sheets

(58) Field of Classification Search
USPC .......................................................... 134/4
See application file for complete search history.

(56) References Cited

U.S. PATENT DOCUMENTS

| | | | |
|---|---|---|---|
| 10,792,712 | B2 | 10/2020 | Yoshida et al. |
| 11,211,241 | B2 * | 12/2021 | Yoshida ............ H01L 21/67051 |
| 2003/0000547 | A1 | 1/2003 | Carpenter et al. ............ 134/1.3 |
| 2007/0087950 | A1 | 4/2007 | Korolik et al. ............... 510/175 |
| 2009/0032067 | A1 | 2/2009 | Kojimaru et al. ............. 134/26 |
| 2011/0165523 | A1 | 7/2011 | Wang et al. .................. 430/331 |
| 2011/0250401 | A1 | 10/2011 | Dudley et al. |
| 2012/0052601 | A1 | 3/2012 | Chumakov et al. .......... 428/161 |
| 2013/0333722 | A1 | 12/2013 | Tanaka ............................ 438/14 |
| 2014/0041685 | A1 | 2/2014 | Kaneko et al. .................... 134/4 |
| 2014/0144464 | A1 | 5/2014 | Kaneko et al. .................... 134/4 |
| 2014/0144465 | A1 | 5/2014 | Kaneko et al. .................... 134/4 |
| 2015/0013917 | A1 | 1/2015 | Inao et al. ........................ 134/1 |
| 2015/0064910 | A1 | 3/2015 | Kaneko et al. ............... 438/694 |
| 2015/0064911 | A1 | 3/2015 | Kaneko et al. ............... 438/694 |
| 2015/0090694 | A1 | 4/2015 | Hashimoto et al. ............. 216/83 |
| 2015/0128994 | A1 | 5/2015 | Kaneko et al. |
| 2015/0128995 | A1 | 5/2015 | Kaneko et al. |
| 2016/0035561 | A1 | 2/2016 | Aibara et al. .................. 134/1.3 |
| 2016/0035564 | A1 | 2/2016 | Aibara et al. |
| 2017/0250097 | A1 | 8/2017 | Hamada et al. |
| 2017/0345685 | A1 * | 11/2017 | Sekiguchi ......... H01L 21/67051 |
| 2017/0365486 | A1 | 12/2017 | Park et al. |
| 2018/0264492 | A1 | 9/2018 | Kaneko et al. ................ 156/703 |

FOREIGN PATENT DOCUMENTS

| | | |
|---|---|---|
| JP | H11-101970 A | 4/1999 |
| JP | 2010-129809 A | 6/2010 |
| JP | 2014-107313 A | 6/2014 |
| JP | 2014-123704 A | 7/2014 |
| JP | 2014-140085 A | 7/2014 |
| JP | 2015-046442 A | 3/2015 |
| JP | 2015-046449 A | 3/2015 |
| JP | 2015-062259 A | 4/2015 |
| JP | 2015-065396 A | 4/2015 |
| JP | 2015-095583 A | 5/2015 |
| JP | 2015-149410 A | 8/2015 |
| JP | 2016-034006 A | 3/2016 |
| KR | 10-2008-0091356 A | 10/2008 |
| KR | 10-2009-0013013 A | 2/2009 |
| TW | 201340229 A | 10/2013 |
| TW | 201637088 A | 10/2016 |
| TW | 201802915 A | 1/2018 |
| WO | WO 2007/078975 A2 | 7/2007 |

* cited by examiner

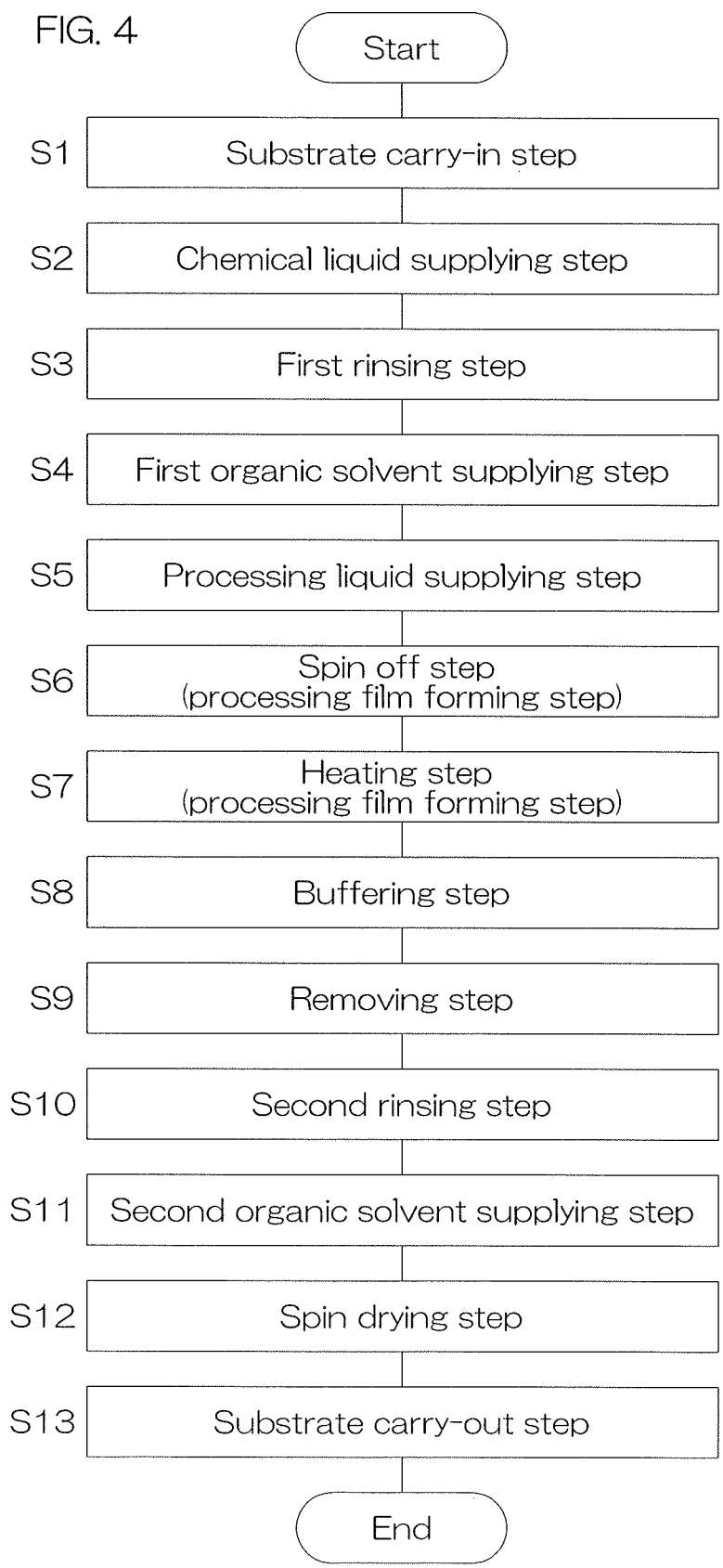

SUBSTRATE PROCESSING METHOD

CROSS REFERENCE TO RELATED APPLICATIONS

The present application is a continuation of U.S. patent application Ser. No. 16/426,119, filed May 30, 2019, which claims priority based on Japanese Patent Application No. 2018-105632 filed on May 31, 2018 and Japanese Patent Application No. 2018-234735 filed on Dec. 14, 2018, and the entire contents of which are incorporated herein by reference.

BACKGROUND OF THE INVENTION

1. Field of the Invention

The present application relates to a substrate processing method and a substrate processing apparatus for processing substrates. Examples of substrates to be processed include substrates, such as semiconductor wafers, substrates for liquid crystal display devices, substrates for FPDs (flat panel displays) such as organic EL (electroluminescence) display devices, etc., substrates for optical disks, substrates for magnetic disks, substrates for magneto-optical disks, substrates for photomasks, ceramic substrates, substrates for solar cells, etc.

2. Description of the Related Art

In a manufacturing process of semiconductor devices, a cleaning step is executed in order to remove various types of contaminants attached on a substrate, a residue of a processing liquid or a resist, etc., used in a prior step and various particles, etc., (they may be hereinafter referred to collectively as "removal object").

In the cleaning step, in general, a cleaning liquid such as deionized water (DIW), etc., is supplied to a substrate, thereby removing a removal object by physical actions of the cleaning liquid, or a chemical liquid which chemically reacts with the removal object is supplied to a substrate, thereby chemically removing the removal object.

However, with progress being made in making a pattern, with projections and recesses, which is formed on a substrate finer and more complex, it is not easy to remove a removal object by using a cleaning liquid or a chemical liquid, while damage to the pattern with projections and recesses is suppressed.

Thus, a method has been proposed where a processing liquid, containing a solute and a solvent having volatility, is supplied to an upper surface of a substrate, the processing liquid is solidified or cured to form a processing film and, thereafter, the processing film is dissolved and removed in United States Patent Application Publication No. 2014/041685.

With the method described above, when the processing liquid is solidified or cured to form a processing film, a removal object is pulled away from a pattern with projections and recesses. Then, the removal object which has been pulled away therefrom is held in the processing film. Next, a dissolution processing liquid is supplied to the upper surface of the substrate. Thereby, since the processing film is dissolved on the substrate and removed, the removal object is removed from the upper surface of the substrate, together with a dissolved matter of the processing film.

SUMMARY OF THE INVENTION

However, with the method disclosed in United States Patent Application Publication No. 2014/041685, a processing film is dissolved on a substrate and, therefore, a removal object may fall off from the processing film on the substrate and the thus fallen removal object may be reattached to the pattern with projections and recesses. Thus, there is a risk that the removal object may not be efficiently removed from the substrate.

Thus, an object of the present invention is to provide a substrate processing method and a substrate processing apparatus which are capable of efficiently removing a removal object present on a pattern, with projections and recesses, which is formed on a substrate.

A preferred embodiment of the present invention provides a substrate processing method including a processing liquid supplying step of supplying a processing liquid to a patterned surface of a substrate having the patterned surface with projections and recesses, a processing film forming step of solidifying or curing the processing liquid supplied to the patterned surface to form, so as to follow the projections and the recesses of the patterned surface, a processing film which holds a removal object present on the patterned surface, and a removing step of supplying a peeling liquid to the patterned surface to peel the processing film from the patterned surface together with the removal object, thereby removing the processing film from the substrate, while such a state is kept that the removal object is held by the processing film.

According to the above-described method, the processing film is formed so as to follow the projections and the recesses of the patterned surface. Therefore, it is possible to reduce a film thickness of the processing film in the entire patterned surface. Consequently, the peeling liquid easily passes through the processing film in the entire patterned surface and also easily reaches an interface between the processing film and the patterned surface.

Further, the processing film is reduced in film thickness to reduce the strength of the processing film. Therefore, the processing film is easily split due to energy received from the peeling liquid flowing on the patterned surface and made into film fragments. Consequently, the peeling liquid is able to smoothly reach an interface between the processing film and the patterned surface from among the split film fragments.

The peeling liquid is made to smoothly reach an interface between the processing film and the patterned surface in the entire patterned surface, thus making it possible to efficiently peel a removal object from the patterned surface together with the processing film. As a result, the removal object can be efficiently removed from the substrate.

In the preferred embodiment of the present invention, the processing film forming step includes a step of forming the processing film such that a film thickness of the processing film becomes thinner than a height of the projections and the recesses of the patterned surface in a thickness direction of the substrate. Therefore, it is possible to reduce a distance between a front surface of the processing film and the patterned surface in the thickness direction of the substrate. Consequently, the peeling liquid can be made to smoothly reach an interface between the patterned surface and the processing film. As a result, it is possible to more efficiently peel a removal object from the patterned surface together with the processing film.

In the preferred embodiment of the present invention, the processing film forming step includes a step of forming the processing film such that, in the interior of a recessed portion of the patterned surface, the front surface of the processing film is positioned further on the side of a bottom portion of the recessed portion than a top portion of a projected portion adjacent to the recessed portion. Therefore, in the processing film forming step, the processing film can be reduced in film thickness in the interior of the recessed portion as compared with a case in which the processing film is formed so as to fill up an entirety of the interior of the recessed portion. Consequently, the peeling liquid can be made to smoothly reach an interface between the bottom portion of the recessed portion on the patterned surface and the processing film. As a result, it is possible to more efficiently peel a removal object from the patterned surface together with the processing film.

In the preferred embodiment of the present invention, the processing film forming step includes a step of forming the processing film such that the processing film covers the removal object. Thereby, since the contact area of the processing film and the removal object can be increased, a holding force that the processing film holds the removal object can be improved. It is, therefore, possible to reduce removal objects which fall off from the processing film. Consequently, most of the removal objects can be removed from a substrate together with the processing film. Therefore, while reattachment of a removal object to the substrate is suppressed, the removal object can be efficiently eliminated outside the substrate.

In the preferred embodiment of the present invention, the processing film forming step includes a step of forming the processing film such that adhesion of the processing film to the removal object becomes larger than adhesion of the removal object to the patterned surface. Therefore, when the processing film is peeled by the peeling liquid from the patterned surface, it is possible to reduce the number of removal objects remaining on the patterned surface without being peeled away from the patterned surface. Consequently, most of the removal objects can be removed from the substrate together with the processing film and the removal objects can be efficiently eliminated outside the substrate.

In the preferred embodiment of the present invention, the removing step includes a penetrating hole forming step of dissolving partially the processing film by the peeling liquid to form a penetrating hole on the processing film. Therefore, the peeling liquid is able to smoothly reach the vicinity of an interface between the processing film and the patterned surface via the penetrating hole. Consequently, the peeling liquid is made to act on an interface between the processing film and the substrate, thus making it possible to efficiently peel the processing film from the substrate.

On the other hand, although the processing film is partially dissolved by the peeling liquid for forming the penetrating hole, a remaining portion thereof can be kept in a solid state. Consequently, it is possible to peel from the patterned surface the processing film on which the penetrating hole is formed and the removal object is held. As a result, the removal object can be efficiently removed from the patterned surface together with the processing film.

In the preferred embodiment of the present invention, the removing step includes a peeling liquid entry step of entering the peeling liquid between the processing film and the patterned surface via the penetrating hole. Therefore, the peeling liquid is made to act on an interface between the processing film and the substrate, thus making it possible to more efficiently peel the processing film from the patterned surface.

In the preferred embodiment of the present invention, the processing liquid has a solute having a first component and a second component which is lower in solubility in the peeling liquid than the first component and a solvent which dissolves the solute. Then, the processing film forming step includes a step of forming the processing film which has a first solid formed by the first component and a second solid formed by the second component.

With the present method, the first component is higher in solubility in the peeling liquid than the second component. Therefore, the first solid formed by the first component is more easily dissolved in the peeling liquid than the second solid formed by the second component.

Therefore, the peeling liquid is used to dissolve the first solid, thus making it possible to reliably form the penetrating hole and also to keep the second solid in a solid state without dissolving the second solid in the peeling liquid. Therefore, in a state where the removal object is held by the second solid, the peeling liquid can be made to act on an interface between the second solid and the substrate. As a result, it is possible to smoothly peel the processing film from the patterned surface and also efficiently remove the removal object from the patterned surface together with the processing film.

In the preferred embodiment of the present invention, the second component contains at least any one of novolac, polyhydroxystyrene, polystyrene, a polyacrylic acid derivative, a polymaleic acid derivative, polycarbonate, a polyvinyl alcohol derivative, a polmethacrylic acid derivative and a copolymer of a combination thereof.

In the preferred embodiment of the present invention, the first component is a crack promoting component, and the crack promoting component contains hydrocarbon, and a hydroxy group and/or a carbonyl group.

In the preferred embodiment of the present invention, the first component is expressed at least by any one of the following (B-1), (B-2) and (B-3).

(B-1) is a compound which contains 1 to 6 of constituent units expressed by Chemical Formula 1 given below and in which each of the constituent units is bonded by a linking group $L_1$.

[Chemical Formula 1]

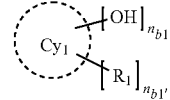

Here, $L_1$ is selected at least from a single bond and any one of $C_{1\sim6}$ alkylenes, $Cy_1$ is a hydrocarbon ring of $C_{5\sim30}$, $R_1$ is each independently $C_{1\sim5}$ alkyl, $n_{b1}$ is 1, 2 or 3, and $n_{b1'}$ is 0, 1, 2, 3 or 4.

(B-2) is a compound expressed by Chemical Formula 2 given below.

[Chemical Formula 2]

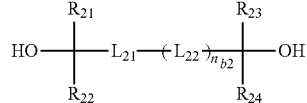

Here, $R_{21}$, $R_{22}$, $R_{23}$ and $R_{24}$ are each independently hydrogen or $C_{1\sim5}$ alkyl, $L_{21}$ and $L_{22}$ are each independently $C_{1\sim20}$ alkylene, $C_{1\sim20}$ cycloalkylene, $C_{2\sim4}$ alkenylene, $C_{2\sim4}$ alkynylene or $C_{6\sim20}$ arylene. These groups may be substituted by $C_{1\sim5}$ alkyl or hydroxyl, and $n_{b2}$ is 0, 1 or 2.

(B-3) is a polymer which contains a constituent unit expressed by Chemical Formula 3 given below and has the weight average molecular weight (Mw) of 500 to 10,000.

[Chemical Formula 3]

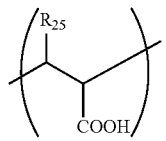

$R_{25}$ is —H, —$CH_3$ or —COOH.

In the preferred embodiment of the present invention, the solubility of the second component in 5.0 mass % ammonia water is less than 100 ppm and the solubility of the first component in 5.0 mass % ammonia water is 100 ppm or more.

In the preferred embodiment of the present invention, as compared with an entire mass of the processing liquid, the mass of the second component is 0.1 to 50 mass %.

In the preferred embodiment of the present invention, the second component is 150 to 500,000 in weight average molecular weight (Mw).

In the preferred embodiment of the present invention, the substrate processing method further includes a substrate rotating step of holding the substrate horizontally to rotate the substrate around a vertical axis which passes through a central portion of the substrate. Then, the substrate rotating step includes a first rotating step of rotating the substrate at a first speed until formation of the processing film from the start of supplying the processing liquid to the patterned surface and a second rotating step of rotating the substrate at a second speed faster than the first speed by accelerating rotation of the substrate until formation of the processing film after the first rotating step.

According to the above-described method, until formation of the processing film from the start of supplying the processing liquid to the patterned surface, the substrate is rotated at the first speed which is a relatively low speed. Therefore, before the processing liquid is shaken off due to a centrifugal force and completely reduced in quantity thereof on the patterned surface, the processing liquid enters into a recessed portion on the patterned surface due to its own weight. Then, until formation of the processing film after the first rotating step, the substrate is rotated at an accelerated speed to eliminate the processing liquid from the patterned surface of the substrate. It is, therefore, possible to form a sufficiently thin processing film in a state where the processing liquid has entered into a recessed portion on the patterned surface due to its own weight.

Another embodiment of the present invention provides that a substrate processing apparatus which includes a processing liquid supplying unit which supplies a processing liquid to a patterned surface on a substrate having the patterned surface with projections and recesses, a solid forming unit which solidifies or cures the processing liquid, a peeling liquid supplying unit which supplies a peeling liquid to the patterned surface and a controller which controls the processing liquid supplying unit, the solid forming unit and the peeling liquid supplying unit.

Then, the controller is programmed to execute a processing liquid supplying step of supplying the processing liquid from the processing liquid supplying unit to the patterned surface, a processing film forming step of solidifying or curing the processing liquid supplied to the patterned surface by the solid forming unit to form, so as to follow the projections and the recesses of the patterned surface, a processing film which holds a removal object present on the patterned surface, and a removing step of supplying a peeling liquid to the patterned surface from the peeling liquid supplying unit to peel the processing film from the patterned surface together with the removal object, thereby removing the processing film from the substrate while such a state is kept that the removal object is held by the processing film.

According to the above-described configuration, the processing film is formed so as to follow the projections and the recesses of the patterned surface. Therefore, the processing film can be reduced in film thickness in the entire patterned surface. Consequently, the peeling liquid can easily pass through the processing film in the entire patterned surface and also easily reach an interface between the processing film and the patterned surface.

Further, the processing film is reduced in film thickness to reduce the strength of the processing film. Therefore, due to energy received from the peeling liquid flowing on the patterned surface, the processing film is easily split into film fragments. Consequently, the peeling liquid is able to smoothly reach an interface between the processing film and the patterned surface from among the split film fragments.

The peeling liquid is made to smoothly reach an interface between the processing film and the patterned surface in the entire patterned surface, thus making it possible to efficiently peel a removal object from the patterned surface together with the processing film. As a result, the removal object can be efficiently removed from the substrate.

In another embodiment of the present invention, the controller is programmed to form the processing film, in the processing film forming step, such that the film thickness of the processing film becomes thinner than the height of the projections and the recesses of the patterned surface in the thickness direction of the substrate. Therefore, it is possible to reduce a distance between the front surface of the processing film and the patterned surface in the thickness direction of the substrate. Consequently, the peeling liquid can be made to smoothly reach an interface between the patterned surface and the processing film. As a result, the removal object can be more efficiently peeled from the patterned surface together with the processing film.

In another embodiment of the present invention, the controller is programmed to form the processing film, in the processing film forming step, such that, in the interior of a recessed portion of the patterned surface, the front surface of the processing film is positioned further on the side of a bottom portion of the recessed portion than a top portion of a projected portion adjacent to the recessed portion. Therefore, in the processing film forming step, the processing film can be reduced in film thickness in the interior of the recessed portion as compared with a case in which the processing film is formed so as to fill up an entirety of the interior of the recessed portion. Consequently, the peeling liquid can be made to smoothly reach an interface between the bottom portion of the recessed portion of the patterned surface and the processing film. As a result, the removal object can be more efficiently peeled from the patterned surface together with the processing film.

In another embodiment of the present invention, the controller is programmed to form the processing film, in the processing film forming step, such that the processing film can cover the removal object. Thereby, since the contact area of the processing film and the removal object can be increased, a holding force that the processing film holds the removal object can be improved. It is, therefore, possible to reduce removal objects falling off from the processing film. Consequently, most of the removal objects can be removed from the substrate together with the processing film. It is possible to efficiently eliminate the removal object outside the substrate, while reattachment of the removal object to the substrate is suppressed.

In another embodiment of the present invention, the controller is programmed to form the processing film, in the processing film forming step, such that adhesion of the processing film to the removal object becomes larger than adhesion of the removal object to the patterned surface. Therefore, it is possible to reduce the number of removal objects remaining on the patterned surface without being peeled away from the patterned surface when the processing film is peeled by the peeling liquid from the patterned surface. Consequently, most of the removal objects can be removed from the substrate together with the processing film to efficiently eliminate the removal object outside the substrate.

In another embodiment of the present invention, the controller is programmed to execute, in the removing step, a penetrating hole forming step of partially dissolving the processing film by the peeling liquid to form a penetrating hole on the processing film. Therefore, the peeling liquid is able to reach an interface between the processing film and the patterned surface via the penetrating hole. The peeling liquid is, therefore, made to act on an interface between the processing film and the substrate, thus making it possible to efficiently peel the processing film from the substrate.

On the other hand, although the processing film is partially dissolved by the peeling liquid for formation of the penetrating hole, a remaining portion thereof is kept in a solid state. Consequently, the processing film on which the penetrating hole is formed and also the removal object is held can be peeled from the patterned surface. As a result, the removal object can be efficiently removed from the patterned surface together with the processing film.

In another embodiment of the present invention, the controller is programmed to execute, in the removing step, a peeling liquid entry step of entering the peeling liquid between the processing film and the patterned surface via the penetrating hole. Therefore, the peeling liquid is made to act on an interface between the processing film and the substrate, thus making it possible to more efficiently peel the processing film from a pattern with projections and recesses.

In another embodiment of the present invention, the processing liquid has a first component and a second component which is lower in solubility in the peeling liquid than the first component and a solvent which dissolves the first component and the second component. Then, the controller is programmed to execute, in the processing film forming step, a step of forming the processing film which has a first solid formed by the first component and a second solid formed by the second component.

According to the above-described configuration, the first component is higher in solubility in the peeling liquid than the second component. Therefore, the first solid formed by the first component is more easily dissolved in the peeling liquid than the second solid formed by the second component.

Therefore, while the peeling liquid is used to dissolve the first solid thus making it possible to reliably form the penetrating hole, the second solid can be maintained in a solid state without dissolving the second solid in the peeling liquid. Therefore, in a state where a removal object is held by the second solid, the peeling liquid can be made to act on an interface between the second solid and the substrate. As a result, while the processing film from the patterned surface is peeled smoothly, it is possible to efficiently remove the removal object from the patterned surface together with the processing film.

In another preferred embodiment of the present invention, the second component contains at least any one of novolac, polyhydroxystyrene, polystyrene, a polyacrylic acid derivative, a polymaleic acid derivative, polycarbonate, a polyvinyl alcohol derivative, a polmethacrylic acid derivative and a copolymer of a combination thereof.

In another preferred embodiment of the present invention, the first component is a crack promoting component, and the crack promoting component contains hydrocarbon, and a hydroxy group and/or a carbonyl group.

In another preferred embodiment of the present invention, the first component is expressed at least by any one of (B-1), (B-2) and (B-3) given below.

(B-1) is a compound which contains 1 to 6 of constituent units expressed by Chemical Formula 4 and in which each of the constituent units is bonded by a linking group $L_1$.

[Chemical Formula 4]

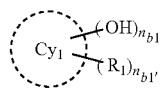

Here, $L_1$ is selected at least from a single bond and any one of $C_{1\sim 6}$ alkylenes, $Cy_1$ is a hydrocarbon ring of $C_{5\sim 30}$, $R_1$ is each independently $C_{1\sim 5}$ alkyl, $n_{b1}$ is 1, 2 or 3, and $n_{b1'}$ is 0, 1, 2, 3 or 4.

(B-2) is a compound which is expressed by Chemical Formula 5.

[Chemical Formula 5]

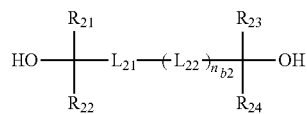

Here, $R_{21}$, $R_{22}$, $R_{23}$ and $R_{24}$ are each independently hydrogen or $C_{1\sim 5}$ alkyl, $L_{21}$ and $L_{22}$ are each independently $C_{1\sim 20}$ alkylene, $C_{1\sim 20}$ cycloalkylene, $C_{2\sim 4}$ alkenylene, $C_{2\sim 4}$ alkynylene or $C_{6\sim 20}$ arylene. These groups may be substituted by $C_{1\sim 5}$ alkyl or hydroxyl, and $n_{b2}$ is 0, 1 or 2.

(B-3) is a polymer which contains a constituent unit expressed by Chemical Formula 6 and has the weight average molecular weight (Mw) of 500 to 10,000.

[Chemical Formula 6]

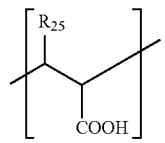

$R_{25}$ is —H, —$CH_3$ or —COOH.

In another preferred embodiment of the present invention, the solubility of the second component in 5.0 mass % ammonia water is less than 100 ppm, and the solubility of the first component in 5.0 mass % ammonia water is 100 ppm or more.

In another preferred embodiment of the present invention, as compared with an entire mass of the processing liquid, the mass of the second component is 0.1 to 50 mass %.

In another preferred embodiment of the present invention, the second component is 150 to 500,000 in weight average molecular weight (Mw).

In another embodiment of the present invention, the substrate processing apparatus further includes a substrate holding unit which holds the substrate horizontally and a substrate rotating unit which rotates the substrate around a vertical axis passing through a central portion of the substrate. Then, the controller is programmed to execute a first rotating step of rotating the substrate held by the substrate holding unit at a first speed by the substrate rotating unit until formation of the processing film from the start of supplying the processing liquid to the patterned surface, and a second rotating step of rotating the substrate at a second speed faster than the first speed by accelerating rotation of the substrate by the substrate rotating unit until formation of the processing film after the first rotating step.

According to the above-described configuration, until formation of the processing film from the start of supplying the processing liquid to the patterned surface, the substrate is rotated at the first speed which is a relatively low speed. Therefore, before the processing liquid is shaken off due to a centrifugal force and completely reduced in quantity thereof on the patterned surface, the processing liquid enters into a recessed portion of the patterned surface due to its own weight. Then, after the first rotating step, the substrate is rotated at an accelerated speed until formation of the processing film to eliminate the processing liquid from the patterned surface on the substrate. Therefore, it is possible to form a sufficiently thin processing film in a state where the processing liquid has entered into a recessed portion of the patterned surface due to its own weight.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 4 is a flowchart for describing one example of substrate processing by the processing unit.

DETAILED DESCRIPTION OF THE PREFERRED EMBODIMENTS

Figure 1:
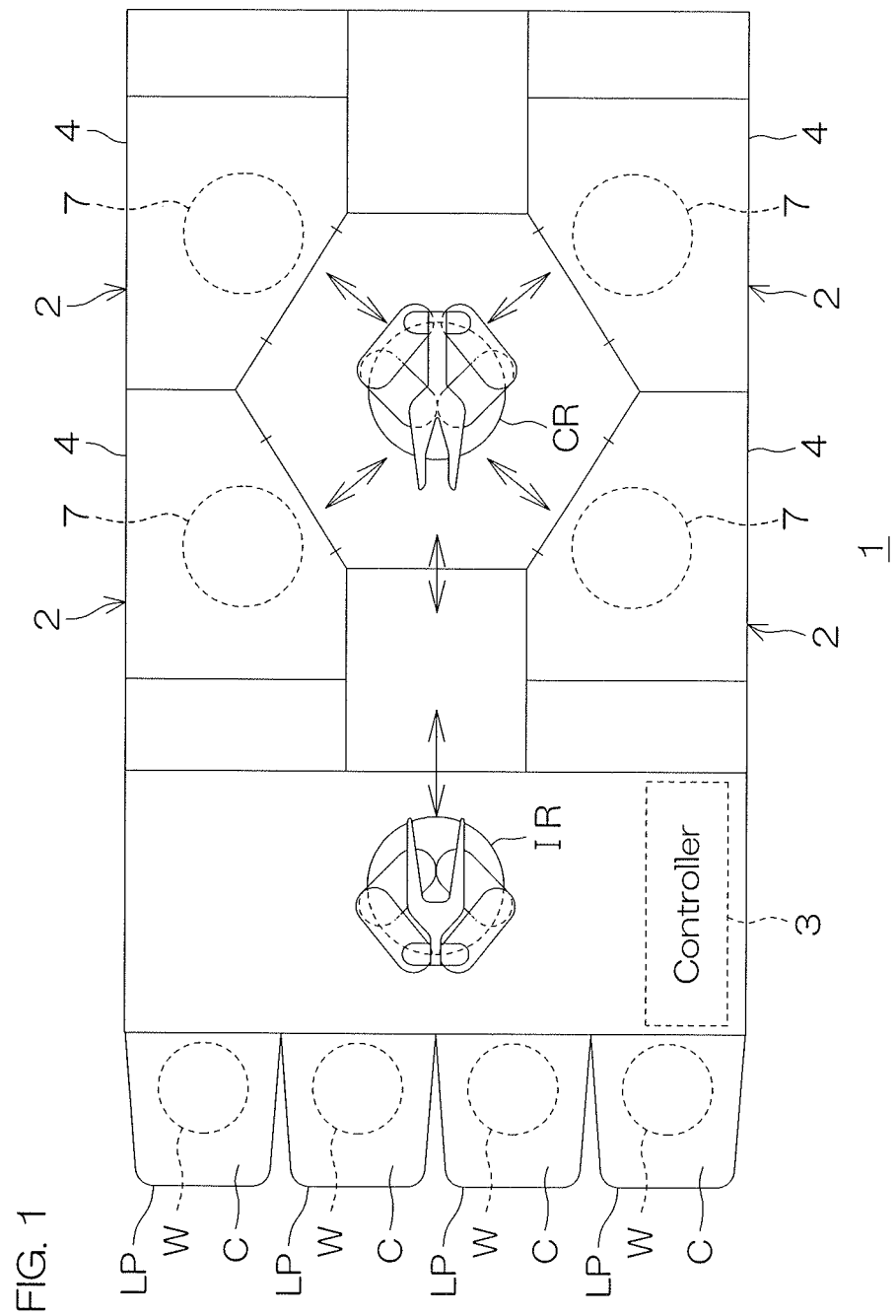
FIG. 1 is a schematic plan view which shows a layout of a substrate processing apparatus according to a preferred embodiment of the present invention.

FIG. 1 is a schematic plan view which shows a layout of a substrate processing apparatus 1 according to a preferred embodiment of the present invention.

The substrate processing apparatus 1 is a single substrate processing type apparatus that processes a substrate W such as a silicon wafer, etc., one at a time. In the present preferred embodiment, the substrate W is a disk-shaped substrate. A fine pattern 160 with projections and recesses (uneven pattern)(refer to FIG. 6 to be described later) is formed on the front surface (main surface) of the substrate W.

The substrate processing apparatus 1 includes a plurality of processing units 2 for processing a substrate W with a fluid, load ports LP on which carriers C that house a plurality of the substrates W to be processed by the processing units 2 are placed, transfer robots IR and CR which transfer the substrates W between the load ports LP and the processing units 2 and a controller 3 which controls the substrate processing apparatus 1.

The transfer robot IR transfers the substrates W between the carriers C and the transfer robot CR. The transfer robot CR transfers the substrates W between the transfer robot IR and the processing units 2. The plurality of processing units 2 have, for example, the same configuration. Although the details will be described later, a processing fluid which is supplied to the substrate W inside the processing unit 2 includes a chemical liquid, a rinse liquid, a processing liquid, a peeling liquid, a heating medium, an inert gas, etc.

Each of the processing units 2 is provided with a chamber 4 and a processing cup 7 which is disposed in the interior of the chamber 4 and executes processing to the substrate W inside the processing cup 7. On the chamber 4, there is formed an inlet/outlet (not shown) for carrying in and carrying out substrates W by the transfer robot CR. The chamber 4 is provided with a shutter unit (not shown) for opening/closing the inlet/outlet.

Figure 2:
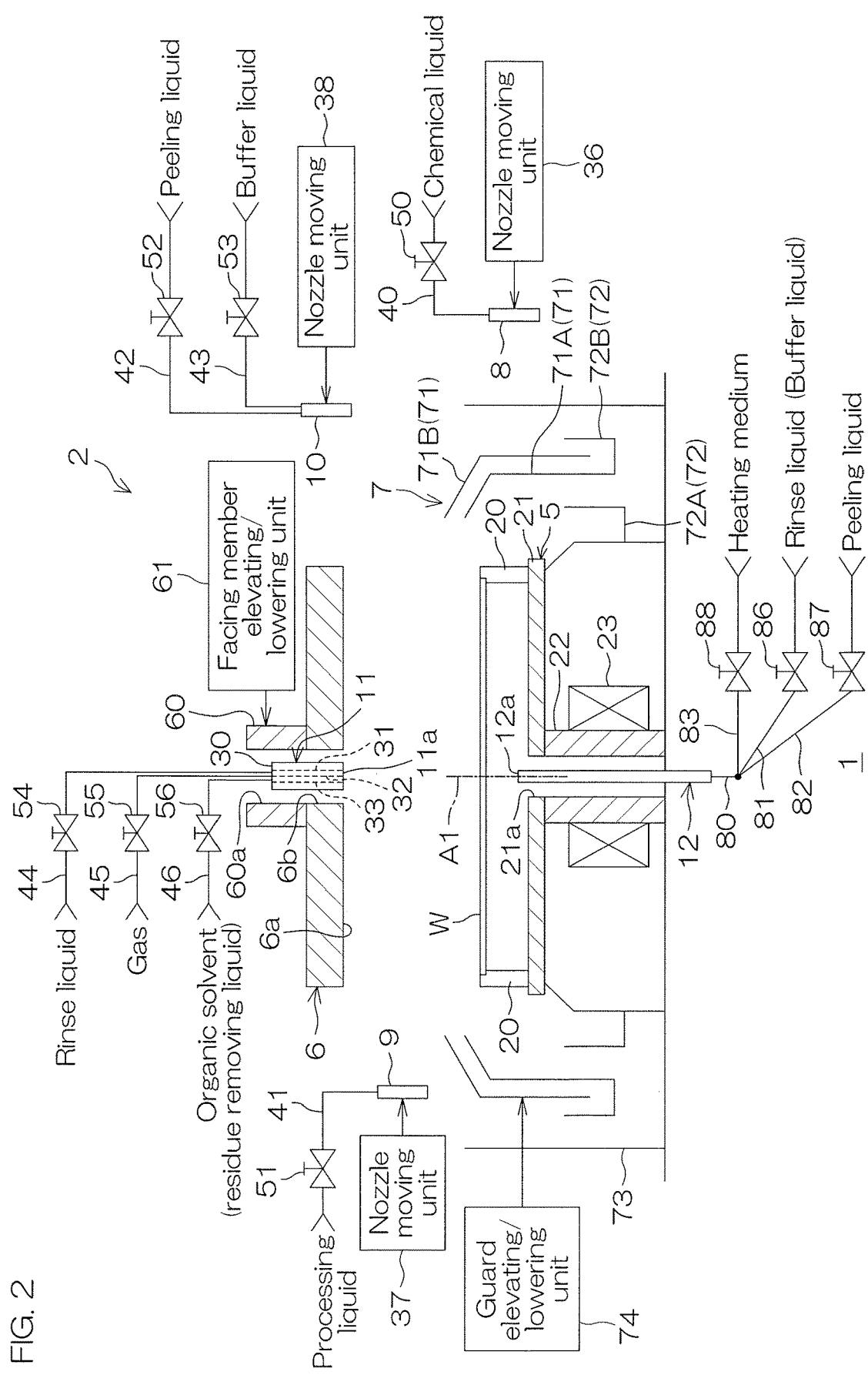
FIG. 2 is a schematic partial sectional view which shows a brief configuration of a processing unit included in the substrate processing apparatus.

FIG. 2 is a schematic view for describing an configuration example of the processing unit 2. The processing unit 2 includes a spin chuck 5, a facing member 6, a processing cup 7, a first moving nozzle 8, a second moving nozzle 9, a third moving nozzle 10, a central nozzle 11 and a lower surface nozzle 12.

The spin chuck 5 rotates a substrate W around a rotational axis A1 (around a vertical axis), while holding the substrate W horizontally. The rotational axis A1 is a vertical axis which passes through a central portion of the substrate W. The spin chuck 5 includes a plurality of chuck pins 20, a spin base 21, a rotating shaft 22 and a spin motor 23.

The spin base 21 is formed in a disk shape oriented along a horizontal direction. A plurality of chuck pins 20 which grip a peripheral edge of the substrate W are disposed on an upper surface of the spin base 21 at interval in a circumferential direction of the spin base 21. A substrate holding unit which holds the substrate W horizontally are configured with the spin base 21 and the plurality of chuck pins 20. The substrate holding unit is also called a substrate holder.

The rotating shaft 22 extends in a vertical direction along the rotational axis A1. An upper end portion of the rotating shaft 22 is coupled to a lower surface center of the spin base 21. The spin motor 23 applies a rotating force to the rotating shaft 22. The rotating shaft 22 is rotated by the spin motor 23, so that the spin base 21 is rotated. Thereby, a substrate W is rotated around the rotational axis A1. The spin motor 23 is an example of the substrate rotating unit which rotates a substrate W around the rotational axis A1.

The facing member 6 faces a substrate W held by the spin chuck 5 from above. The facing member 6 is formed in a disk shape having substantially the same diameter as or a diameter larger than that of the substrate W. The facing member 6 has a facing surface 6a which faces an upper surface (main surface on the upper side) of the substrate W. The facing surface 6a is disposed substantially along a horizontal surface above from the spin chuck 5.

A hollow shaft 60 is fixed to the facing member 6 at an opposite side to the facing surface 6a. A communicating hole 6b which penetrates vertically through the facing member 6 and is in communication with an internal space 60a of the hollow shaft 60 is formed at a portion of the facing member 6 overlapping with the rotational axis A1 in a plan view.

The facing member 6 blocks an atmosphere inside a space between the facing surface 6a and the upper surface of the substrate W from an atmosphere outside the space. The facing member 6 is thus also called a blocking plate.

The processing unit 2 further includes a facing member elevating/lowering unit 61 that drives elevation and lowering of the facing member 6. The facing member elevating/lowering unit 61 is capable of positioning the facing member 6 at any position (height) from a lower position to an upper position. The lower position is a position within a movable range of the facing member 6 at which the facing surface 6a is positioned most proximate to a substrate W. The upper position is a position within the movable range of the facing member 6 at which the facing surface 6a is separated farthest from the substrate W.

The facing member elevating/lowering unit 61 includes, for example, a ball-screw mechanism (not shown) mounted to a supporting member (not shown) that supports the hollow shaft 60 and an electric motor (not shown) that applies a driving force to the ball-screw mechanism. The facing member elevating/lowering unit 61 is also called a facing member lifter (blocking plate lifter).

The processing cup 7 is housed inside the chamber 4 (refer to FIG. 1). The processing cup 7 includes a plurality of guards 71 that receive a liquid splashed outside from a substrate W held by the spin chuck 5, a plurality of cups 72 that receive a liquid guided downward by the plurality of guards 71, and a circular-cylindrical outer wall member 73 that surrounds the plurality of guards 71 and the plurality of cups 72.

In the present preferred embodiment, there is shown an example which has two guards 71 (a first guard 71A and a second guard 71B) and two cups 72 (a first cup 72A and a second cup 72B).

Each of the first cup 72A and the second cup 72B has an annular groove shape which is opened upward.

The first guard 71A is disposed so as to surround the spin base 21. The second guard 71B is disposed so as to surround the spin base 21 outer side in a rotational radius direction of a substrate W from the first guard 71A.

Each of the first guard 71A and the second guard 71B is formed substantially in a circular cylindrical shape, and an upper end portion of each of the guards 71 is inclined inward toward the spin base 21.

The first cup 72A receives a liquid guided downward by the first guard 71A. The second cup 72B is formed integrally with the first guard 71A and receives a liquid guided downward by the second guard 71B.

The processing unit 2 includes a guard elevating/lowering unit 74 which elevates and lowers separately the first guard 71A and the second guard 71B. The guard elevating/lowering unit 74 elevates and lowers the first guard 71A between a lower position and an upper position. The guard elevating/lowering unit 74 elevates and lowers the second guard 71B between a lower position and an upper position.

When the first guard 71A and the second guard 71B are both positioned at the upper position, a liquid splashed from a substrate W is received by the first guard 71A. When the first guard 71A is positioned at the lower position and the second guard 71B is positioned at the upper position, a liquid splashed from a substrate W is received by the second guard 71B.

The guard elevating/lowering unit 74 includes, for example, a first ball-screw mechanism (not shown) coupled to the first guard 71A, a first motor (not shown) which applies a driving force to the first ball screw mechanism, a second ball-screw mechanism (not shown) coupled to the second guard 71B, and a second motor (not shown) which applies a driving force to the second ball-screw mechanism. The guard elevating/lowering unit 74 is also called a guard lifter.

The first moving nozzle 8 is an example of the chemical liquid supplying unit which supplies (discharges) a chemical liquid to an upper surface of a substrate W held by the spin chuck 5.

The first moving nozzle 8 is moved by the first nozzle moving unit 36 in a horizontal direction and in a vertical direction. The first moving nozzle 8 is capable of moving between a center position and a home position (retreat position). When positioned at the center position, the first moving nozzle 8 faces a rotation center of an upper surface on a substrate W. The rotation center of the upper surface of the substrate W is a position of intersection of the rotational axis A1 on the upper surface of the substrate W.

When positioned at the home position, the first moving nozzle 8 does not face the upper surface of the substrate W and is positioned outside the processing cup 7 in a plan view. The first moving nozzle 8 moves in the vertical direction and is thereby capable of moving close to the upper surface of the substrate W and retreating upward from the upper surface of the substrate W.

The first nozzle moving unit 36 includes, for example, a pivoting shaft (not shown) along the vertical direction, an arm (not shown) which is coupled to the pivoting shaft and extends horizontally and a pivoting shaft driving unit (not shown) which elevates, lowers and pivots the pivoting shaft.

The pivoting shaft driving unit pivots the pivoting shaft around a vertical pivoting axis, thereby swinging the arm. The pivoting shaft driving unit elevates and lowers the pivoting shaft along the vertical direction, thereby moving the arm up and down. The first moving nozzle 8 is fixed to the arm. The first moving nozzle 8 moves in the horizontal direction and in the vertical direction, depending on swinging and elevation/lowering of the arm.

The first moving nozzle 8 is connected to a chemical liquid piping 40 which guides a chemical liquid. When a chemical liquid valve 50 interposed in the chemical liquid piping 40 is opened, the chemical liquid is continuously discharged downward from the first moving nozzle 8.

The chemical liquid discharged from the first moving nozzle 8 is a liquid which contains at least any one of, for example, sulfuric acid, acetic acid, nitric acid, hydrochloric acid, hydrofluoric acid, ammonia water, hydrogen peroxide water, an organic acid (for example, citric acid and oxalic acid), an organic alkali (for example, TMAH: tetramethyl-ammonium hydroxide, etc.), a surfactant, and a corrosion inhibitor. As examples of the chemical liquid of their mixture, SPM solution (sulfuric acid/hydrogen peroxide mixture), SC1 solution (ammonia-hydrogen peroxide mixture), etc., can be cited.

The second moving nozzle 9 is an example of the processing liquid supplying unit which supplies (discharges) a processing liquid to an upper surface of a substrate W held by the spin chuck 5.

The second moving nozzle 9 is moved by the second nozzle moving unit 37 in the horizontal direction and in the vertical direction. The second moving nozzle 9 is capable of moving between a center position and a home position (retreat position). When positioned at the center position, the second moving nozzle 9 faces the rotation center of the upper surface of the substrate W.

When positioned at the home position, the second moving nozzle 9 does not face the upper surface of the substrate W and is positioned outside the processing cup 7 in a plan view. The second moving nozzle 9 moves in the vertical direction and is thereby capable of moving close to the upper surface of the substrate W and retreating upward from the upper surface of the substrate W.

The second nozzle moving unit 37 has the same configuration as the first nozzle moving unit 36. That is, the second nozzle moving unit 37 includes, for example, a pivoting shaft (not shown) oriented along the vertical direction, an arm (not shown) which is coupled to the pivoting shaft and the second moving nozzle 9 and extends horizontally, and a pivoting shaft driving unit (not shown) that elevates, lowers and pivots the pivoting shaft.

The second moving nozzle 9 is connected to a processing liquid piping 41 that guides a processing liquid. When a processing liquid valve 51 interposed in the processing liquid piping 41 is opened, the processing liquid is continuously discharged downward from the second moving nozzle 9.

The processing liquid discharged from the second moving nozzle 9 contains a solute and a solvent. The processing liquid is solidified or cured at least by partial volatilization (evaporation) of the solvent. The processing liquid is solidified or cured on a substrate W to form a processing film which holds a removal object such as particles present on the substrate W.

Here, "solidification" refers, for example, to hardening of the solute due to forces acting between molecules or between atoms, etc., in association with volatilization (evaporation) of the solvent. "Curing" refers, for example, to hardening of the solute due to a chemical change such as polymerization and crosslinking. "Solidification or curing" thus expresses "hardening" of the solute due to various causes.

The first component and the second component are contained in the solute in the processing liquid discharged from the second moving nozzle 9. A quantity (contained amount) of the first component contained in the processing liquid is smaller than a quantity (contained amount) of the second component contained in the processing liquid.

The first component and the second component are, for example, synthetic resins which are mutually different in properties. The solvent contained in the processing liquid discharged from the second moving nozzle 9 may be any liquid which will dissolve the first component and the second component.

As examples of the synthetic resin used as the solute, acrylic resins, phenol resins, epoxy resins, melamine resins, urea resins, unsaturated polyester resins, alkyd resins, polyurethane, polyimide, polyethylene, polypropylene, polyvinyl chloride, polystyrene, polyvinyl acetate, polytetrafluoroethylene, acrylonitrile-butadiene-styrene resins, acrylonitrile-styrene resins, polyamide, polyacetal, polycarbonate, polyvinyl alcohol, modified polyphenylene ether, polybutylene terephthalate, polyethylene terephthalate, polyphenylene sulfide, polysulfone, polyether ether ketone, polyamide-imide, etc., can be cited.

As solvents which will dissolve the synthetic resin, IPA, PGEE (propylene glycol monoethyl ether), PGMEA (propylene glycol monomethyl ether 2-acetate), EL (ethyl lactate), etc., can be cited.

The third moving nozzle 10 is an example of the peeling liquid supplying unit which supplies (discharges) a peeling liquid to an upper surface of a substrate W held by the spin chuck 5. In the present preferred embodiment, it is also an example of the buffer liquid supplying unit which supplies (discharges) a buffer liquid to an upper surface of a substrate W held by the spin chuck 5.

The third moving nozzle 10 is moved by the third nozzle moving unit 38 in the horizontal direction and in the vertical direction. The third moving nozzle 10 is capable of moving between a center position and a home position (retreat position).

When positioned at the center position, the third moving nozzle 10 faces the rotation center of the upper surface of the substrate W. When positioned at the home position, the third moving nozzle 10 does not face the upper surface of the substrate W and is positioned outside the processing cup 7 in a plan view. The third moving nozzle 10 moves in the vertical direction and is thereby capable of moving close to the upper surface of the substrate W and retreating upward from the upper surface of the substrate W.

The third nozzle moving unit 38 has the same configuration as the first nozzle moving unit 36. That is, the third nozzle moving unit 38 includes, for example, a pivoting shaft (not shown) oriented along the vertical direction, an arm (not shown) which is coupled to the pivoting shaft and the third moving nozzle 10 and extends horizontally and a pivoting shaft driving unit (not shown) which elevates, lowers and pivots the pivoting shaft.

The third moving nozzle 10 is connected to an upper peeling liquid piping 42 which guides a peeling liquid to the third moving nozzle 10. When an upper peeling liquid valve 52 interposed in the upper peeling liquid piping 42 is opened, the peeling liquid is continuously discharged downward from a discharge port of the third moving nozzle 10.

The third moving nozzle 10 is also connected to an upper buffer liquid piping 43 which guides a buffer liquid to the third moving nozzle 10. When an upper buffer liquid valve 53 interposed in the upper buffer liquid piping 43 is opened, the buffer liquid is continuously discharged downward from the discharge port of the third moving nozzle 10.

The peeling liquid is a liquid for peeling a processing film on the substrate W from the upper surface of the substrate W. As the peeling liquid, there is used a liquid that will dissolve more easily the first component contained in the solute of the processing liquid than the second component contained in the solute of the processing liquid. In other words, as the peeling liquid, there is used a liquid in which the solubility (degree of solubility) of the first component in the peeling liquid is higher than the solubility (degree of solubility) of the second component in the peeling liquid. The peeling liquid is preferably a liquid which has compatibility (mixable) with the solvent contained in the processing liquid.

The peeling liquid is, for example a water-based peeling liquid. As examples of the water-based peeling liquid, DIW, carbonated water, electrolyzed ion water, hydrogen water, ozone water, aqueous hydrochloric acid solution of dilute concentrations (for example, approximately 10 ppm to 100 ppm), aqueous alkaline solution, etc., can be cited. As examples of the aqueous alkaline solution, SC1 solution, aqueous ammonia solution, aqueous solution of a quaternary ammonium hydroxide such as TMAH, aqueous choline solution, etc., can be cited.

A buffer liquid is a liquid for buffering peeling actions of a peeling liquid on a processing film. The buffer liquid is supplied to the processing film before supply of the peeling liquid, thus making it possible to avoid actions of the peeling liquid with high concentrations on a part of the processing film. The buffer liquid is supplied to the processing film before supply of the peeling liquid, and the peeling liquid can be uniformly applied to the entire processing film.

As examples of the buffer liquid, DIW, carbonated water, electrolyzed ion water, aqueous hydrochloric acid solution of dilute concentrations (for example, approximately 10 ppm to 100 ppm), ammonia water of dilute concentrations (for example, approximately 1 ppm to 100 ppm), reduced water (hydrogen water), etc., can be cited.

The central nozzle 11 is housed in the internal space 60a of the hollow shaft 60 of the facing member 6. A discharge port 11a formed at the leading end of the central nozzle 11 faces a central region on an upper surface of a substrate W from above. The central region on the upper surface of the substrate W is a region which includes a rotation center of the substrate W on the upper surface of the substrate W.

The central nozzle 11 includes a plurality of tubes (a first tube 31, a second tube 32 and a third tube 33) which discharge a fluid downward and a tubular casing 30 which surrounds the plurality of tubes. The plurality of tubes and the casing 30 extend in an up/down direction oriented along the rotational axis A1. The discharge port 11a of the central nozzle 11 also serves as a discharge port of the first tube 31, also serves as a discharge port of the second tube 32 and also serves as a discharge port of the third tube 33.

The first tube 31 is an example of a rinse liquid supplying unit which supplies a rinse liquid to an upper surface of a substrate W. The second tube 32 is an example of a gas supplying unit which supplies a gas between an upper surface of a substrate W and the facing surface 6a of the facing member 6. The third tube 33 is an example of an organic solvent supplying unit which supplies an organic solvent such as IPA to an upper surface of a substrate W.

The first tube 31 is connected to an upper rinse liquid piping 44 which guides a rinse liquid to the first tube 31. When an upper rinse liquid valve 54 interposed in the upper rinse liquid piping 44 is opened, the rinse liquid is continuously discharged to the central region on the upper surface of the substrate W from the first tube 31 (central nozzle 11).

As examples of the rinse liquid, DIW, carbonated water, electrolyzed ion water, aqueous hydrochloric acid solution of dilute concentrations (for example, approximately 1 ppm to 100 ppm), ammonia water of dilute concentrations (for example, approximately 1 ppm to 100 ppm), reduced water (hydrogen water), etc., can be cited. That is, as the rinse liquid, there can be used a liquid similar to the buffer liquid. The rinse liquid is a liquid similar to the buffer liquid and, therefore, the first tube 31 is also an example of the buffer liquid supplying unit.

The second tube 32 is connected to a gas piping 45 which guides a gas to the second tube 32. When a gas valve 55 interposed in the gas piping 45 is opened, a gas is continuously discharged downward from the second tube 32 (central nozzle 11).

The gas discharged from the second tube 32 is an inert gas, for example, nitrogen gas ($N_2$), etc. The gas discharged from the second tube 32 may be air. The inert gas is not restricted to nitrogen gas and is a gas which is inert to an upper surface of a substrate W and a pattern formed on the upper surface of the substrate W. As examples of the inert gas, other than nitrogen gas, noble gas such as argon can be cited.

The third tube 33 is connected to an organic solvent piping 46 which guides an organic solvent to the third tube 33. When an organic solvent valve 56 interposed in the organic solvent piping 46 is opened, the organic solvent is continuously discharged to the central region on the upper surface of the substrate W from the third tube 33 (central nozzle 11).

The organic solvent discharged from the third tube 33 is a residue removing liquid for removing residue remaining on the upper surface of the substrate W after removal of a processing film by a peeling liquid. It is preferable that the organic solvent discharged from the third tube 33 has compatibility with a processing liquid and a rinse liquid.

As examples of the organic solvent discharged from the third tube 33, a liquid which contains at least any one of IPA, HFE (hydrofluoroether), methanol, ethanol, acetone and trans-1,2-dichloroethylene, etc., can be cited.

Further, the organic solvent discharged from the third tube 33 is not necessarily made up of only a single component but may be a liquid which is mixed with other components. The organic solvent discharged from the third tube 33 may be, for example, a liquid mixture of IPA and DIW or may be a liquid mixture of IPA and HFE.

The lower surface nozzle 12 is inserted into a penetrating hole 21a which is opened at an upper surface central portion of the spin base 21. A discharge port 12a of the lower surface nozzle 12 is exposed from an upper surface of the spin base 21. The discharge port 12a of the lower surface nozzle 12 faces a central region on a lower surface of a substrate W from below. The central region on the lower surface of the substrate W is a region which includes the rotation center of the substrate W on the lower surface of the substrate W.

One end of a common piping 80 which commonly guides a rinse liquid, a peeling liquid and a heating medium to the lower surface nozzle 12 is connected to the lower surface nozzle 12. A lower rinse liquid piping 81 which guides the rinse liquid to the common piping 80, a lower peeling liquid piping 82 which guides the peeling liquid to the common piping 80 and a heating medium piping 83 which guides the heating medium to the common piping 80 are connected to the other end of the common piping 80.

When a lower rinse liquid valve 86 interposed in the lower rinse liquid piping 81 is opened, the rinse liquid is continuously discharged to the central region on the lower surface of the substrate W from the lower surface nozzle 12. When a lower peeling liquid valve 87 interposed in the lower peeling liquid piping 82 is opened, the peeling liquid is continuously discharged to the central region on the lower surface of the substrate W from the lower surface nozzle 12. When a heating medium valve 88 interposed in the heating medium piping 83 is opened, the heating medium is continuously discharged to the central region on the lower surface of the substrate W from the lower surface nozzle 12.

The lower surface nozzle 12 is an example of a lower rinse liquid supplying unit which supplies a rinse liquid to a lower surface of a substrate W. The liquid which is used as the rinse liquid can be used as a buffer liquid and, therefore, the lower surface nozzle 12 is also an example of a lower buffer liquid supplying unit.

Further, the lower surface nozzle 12 is an example of a lower peeling liquid supplying unit which supplies a peeling liquid to a lower surface of a substrate W. Further, the lower surface nozzle 12 is an example of a heating medium supplying unit which supplies a heating medium for heating a substrate W to the substrate W. The lower surface nozzle 12 is also a substrate heating unit which heats the substrate W.

The heating medium discharged from the lower surface nozzle 12 is, for example, high temperature DIW (for example, 60° C. to 80° C.), the temperature of which is higher than a room temperature and lower than a boiling point of a solvent contained in a processing liquid. The heating medium discharged from the lower surface nozzle 12 is not restricted to the high temperature DIW but may be a high temperature gas such as high temperature inert gas or high temperature air (for example, 60° C. to 80° C.), the temperature of which is higher than a room temperature and lower than a boiling point of a solvent contained in a processing liquid.

Figure 3:
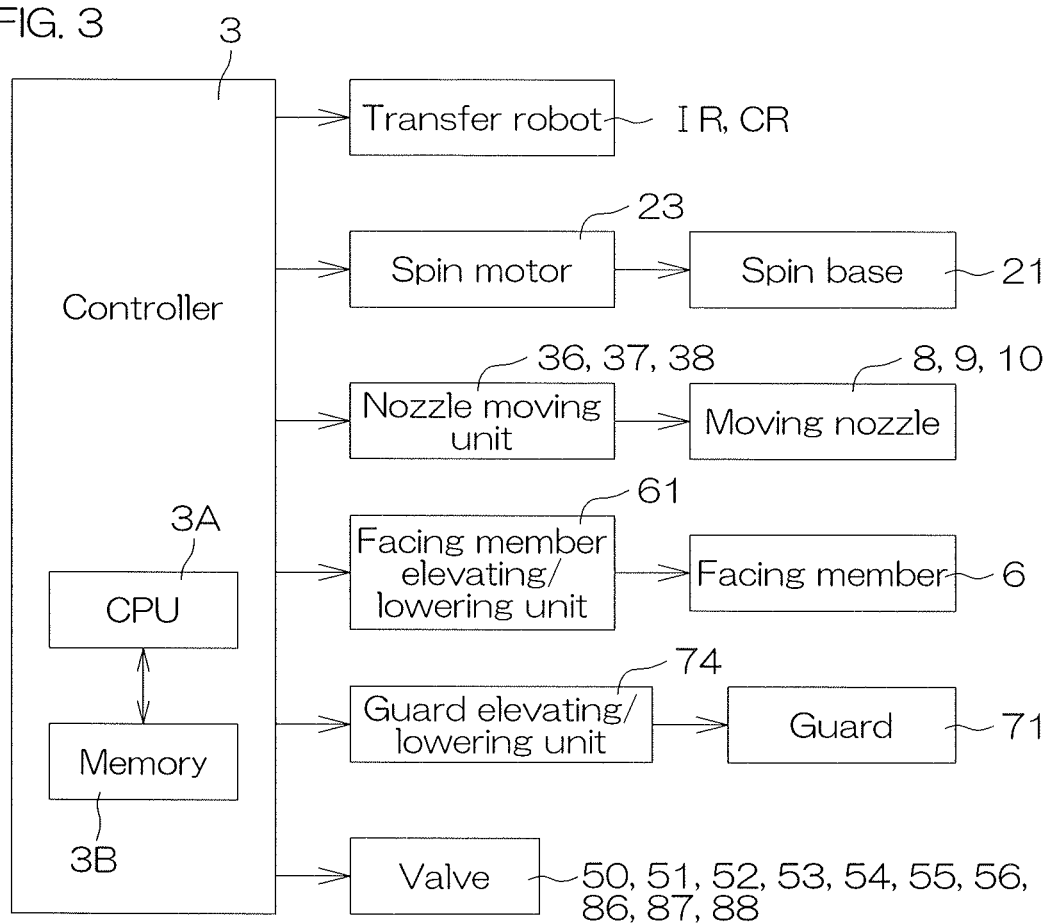
FIG. 3 is a block diagram which shows an electrical configuration of a main portion in the substrate processing apparatus.

FIG. 3 is a block diagram for describing an electrical configuration of a main portion of the substrate processing apparatus 1. The controller 3 includes a microcomputer and controls control objects included in the substrate processing apparatus 1 in accordance with a predetermined control program.

Specifically, the controller 3 includes a processor (CPU) 3A and a memory 3B that stores control programs. The controller 3 is configured so as to execute various types of control for substrate processing by control programs executed by the processor 3A.

The controller 3 is programmed to control, in particular, the transfer robots IR, CR, the spin motor 23, the first nozzle moving unit 36, the second nozzle moving unit 37, the third nozzle moving unit 38, the facing member elevating/lowering unit 61, the guard elevating/lowering unit 74, the chemical liquid valve 50, the processing liquid valve 51, the upper peeling liquid valve 52, the upper buffer liquid valve 53, the upper rinse liquid valve 54, the gas valve 55, the organic solvent valve 56, the lower rinse liquid valve 86, the lower peeling liquid valve 87 and the heating medium valve 88.

FIG. 4 is a flowchart for describing one example of the substrate processing by the substrate processing apparatus 1. FIG. 4 shows the processing which is realized mainly by execution of a program by the controller 3. FIG. 5A to FIG. 5H are each a schematic view for describing conditions of each step of the substrate processing.

In the substrate processing by the substrate processing apparatus 1, for example, as shown in FIG. 4, a substrate carry-in step (Step S1), a chemical liquid supplying step (Step S2), a first rinsing step (Step S3), a first organic solvent supplying step (Step S4), a processing liquid supplying step (Step S5), a spin off step (Step S6), a heating step (Step S7), a buffering step (Step S8), a removing step (Step S9), a second rinsing step (Step S10), a second organic solvent supplying step (Step S11), a spin drying step (Step S12) and a substrate carry-out step (Step S13) are executed in this order.

An unprocessed substrate W is, first, carried from a carrier C into a processing unit 2 by the transfer robots IR, CR (refer to FIG. 1) and transferred to the spin chuck 5 (Step S1). Thereby, the substrate W is held horizontally by the spin chuck 5 (a substrate holding step). The holding of the substrate W by the spin chuck 5 is continued until the spin drying step (Step S12) ends. When the substrate W is carried in, the facing member 6 retreats at the upper position.

Next, after the transfer robot CR has retreated outside the processing unit 2, the chemical liquid supplying step (Step S2) is started. Specifically, the spin motor 23 rotates the spin base 21. Thereby, the substrate W held horizontally is rotated (the substrate rotating step). Then, the guard elevating/lowering unit 74 moves the first guard 71A and the second guard 71B to the upper position.

Then, the first nozzle moving unit 36 allows the first moving nozzle 8 to move to a processing position. The processing position of the first moving nozzle 8 is, for example, a central position. The chemical liquid valve 50 is then opened. Thereby, a chemical liquid is supplied (discharged) from the first moving nozzle 8 to a central region on the upper surface of the substrate W in a rotating state. In the chemical liquid supplying step, the substrate W is rotated at a predetermined chemical liquid rotational speed, for example, 800 rpm.

The chemical liquid supplied to the upper surface of the substrate W spreads radially by being subjected to a centrifugal force and extends across the entire upper surface of the substrate W. Thereby, the upper surface of the substrate W is processed by the chemical liquid. Discharge of the chemical liquid from the first moving nozzle 8 continues for a predetermined time, for example, 30 seconds.

Next, the first rinsing step (Step S3) is started. In the first rinsing step, the chemical liquid on the substrate W is washed away with a rinse liquid.

Specifically, the chemical liquid valve 50 is closed. Thereby, supply of the chemical liquid to the substrate W is stopped. Then, the first nozzle moving unit 36 moves the first moving nozzle 8 to the home position. Then, the facing member elevating/lowering unit 61 allows the facing member 6 to move to the processing position between the upper position and the lower position. When the facing member 6 is positioned at the processing position, a distance between the upper surface of the substrate W and the facing surface 6a is, for example, 30 mm. In the first rinsing step, the positions of the first guard 71A and the second guard 71B are kept at the upper position.

Then, the upper rinse liquid valve 54 is opened. Thereby, a rinse liquid is supplied (discharged) from the central nozzle 11 toward the central region on the upper surface of the substrate W in the rotating state. Further, the lower rinse liquid valve 86 is opened. Thereby, the rinse liquid is supplied (discharged) from the lower surface nozzle 12 toward the central region on the lower surface of the substrate W in the rotating state. In the first rinsing step, the substrate W is rotated at a predetermined first rinse rotational speed, for example, 800 rpm.

The rinse liquid supplied to the upper surface of the substrate W from the central nozzle 11 spreads radially by being subjected to a centrifugal force and extends across the entire upper surface of the substrate W. Thereby, the chemical liquid on the upper surface of the substrate W is washed away outside the substrate W.

The rinse liquid supplied to the lower surface of the substrate W from the lower surface nozzle 12 spreads radially by being subjected to a centrifugal force and extends across the entire lower surface of the substrate W. Even where the chemical liquid splashed from the substrate W by the chemical liquid supplying step is attached to the lower surface thereof, the chemical liquid attached to the lower surface is washed away with the rinse liquid supplied from the lower surface nozzle 12. Discharge of the rinse liquid from the central nozzle 11 and the lower surface nozzle 12 continues for a predetermined time, for example, 30 seconds.

Next, the first organic solvent supplying step (Step S4) is started. In the first organic solvent supplying step, the rinse liquid on the substrate W is replaced with an organic solvent.

Specifically, the upper rinse liquid valve 54 and the lower rinse liquid valve 86 are closed. Thereby, supply of the rinse liquid to the upper surface and the lower surface of the substrate W is stopped. Then, in a state where the guard elevating/lowering unit 74 keeps the second guard 71B at the upper position, the first guard 71A is moved to the lower position. The facing member 6 is kept at the processing position.

In the first organic solvent supplying step, the substrate W is rotated at a predetermined first organic solvent rotational speed, for example, 300 rpm to 1500 rpm. It is not necessary to rotate the substrate W at a fixed rotational speed in the first organic solvent supplying step. For example, the spin motor 23 may rotate the substrate W at 300 rpm at the start of supplying an organic solvent and may accelerate rotation of the substrate W until the rotational speed of the substrate W reaches 1500 rpm, while supplying the organic solvent to the substrate W.

Then, the organic solvent valve 56 is opened. Thereby, the organic solvent is supplied (discharged) from the central nozzle 11 toward the central region on the upper surface of the substrate W in the rotating state.

The organic solvent supplied from the central nozzle 11 to the upper surface of the substrate W spreads radially by being subjected to a centrifugal force and extends across the entire upper surface of the substrate W. Thereby, the rinse liquid on the substrate W is replaced with the organic solvent. Discharge of the organic solvent from the central nozzle 11 continues for a predetermined time, for example, 10 seconds.

Next, the processing liquid supplying step (Step S5) is started. Specifically, the organic solvent valve 56 is closed. Thereby, supply of the organic solvent to the substrate W is stopped. Then, the facing member elevating/lowering unit 61 moves the facing member 6 to the upper position. Then, the guard elevating/lowering unit 74 moves the first guard 71A to the upper position. In the processing liquid supplying step, the substrate W is rotated at a predetermined first rotational speed, for example, several dozen (tens) of rpm to 200 rpm (first rotating step).

Figure 5A:
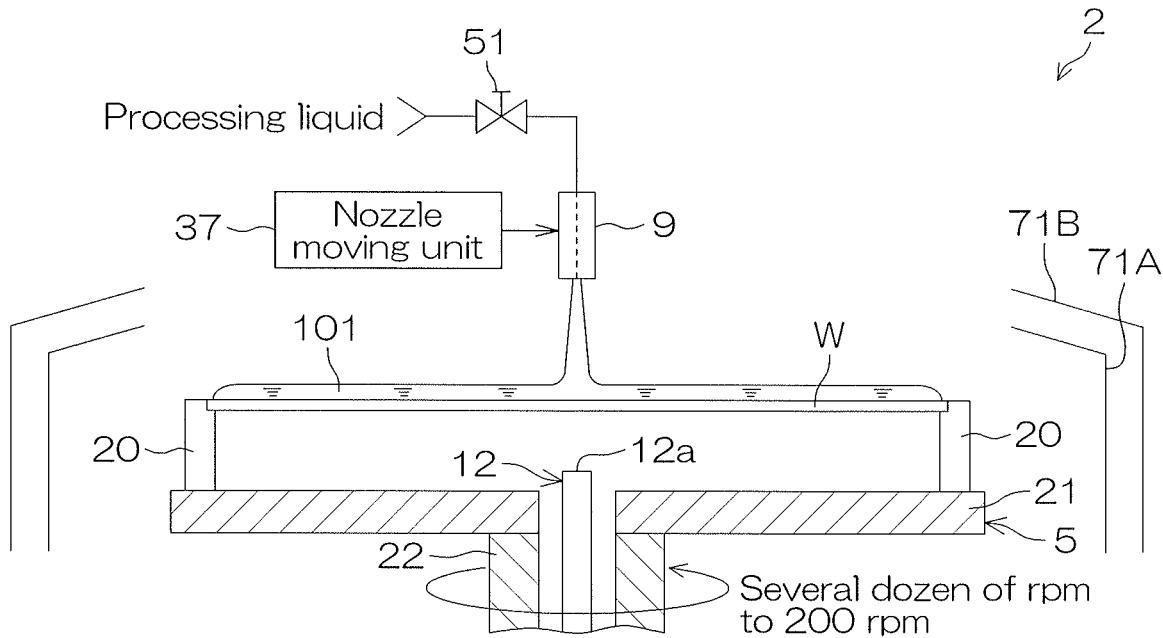
FIG. 5A is a schematic view for describing conditions of a processing liquid supplying step (Step S5) in the substrate processing.

Then, as shown in FIG. 5A, the second nozzle moving unit 37 moves the second moving nozzle 9 to the processing position. The processing position of the second moving nozzle 9 is, for example, the central position. Then, the processing liquid valve 51 is opened. Thereby, the processing liquid is supplied (discharged) from the second moving nozzle 9 toward the central region on the upper surface of the substrate W in the rotating state (the processing liquid supplying step, the processing liquid discharging step). Thereby, the organic solvent on the substrate W is replaced with the processing liquid to form a liquid film of the processing liquid on the substrate W (a processing liquid film 101) (the processing liquid film forming step). Supply of the processing liquid from the second moving nozzle 9 continues for a predetermined time, for example, 2 to 4 seconds.

Next, the processing film forming step (Step S6 and Step S7) is executed. In the processing film forming step, the processing liquid on the substrate W is solidified or cured to form a processing film 100 (refer to FIG. 5C) on the upper surface of the substrate W.

Figure 5B:
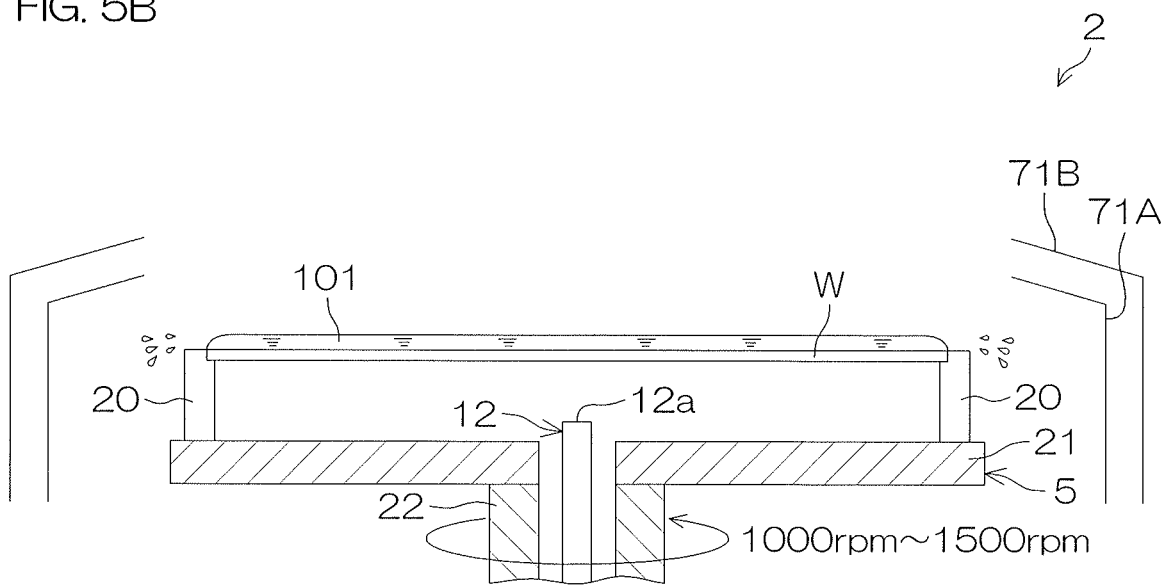
FIG. 5B is a schematic view for describing conditions of a spin off step (Step S6) in the substrate processing.
Figure 5C:
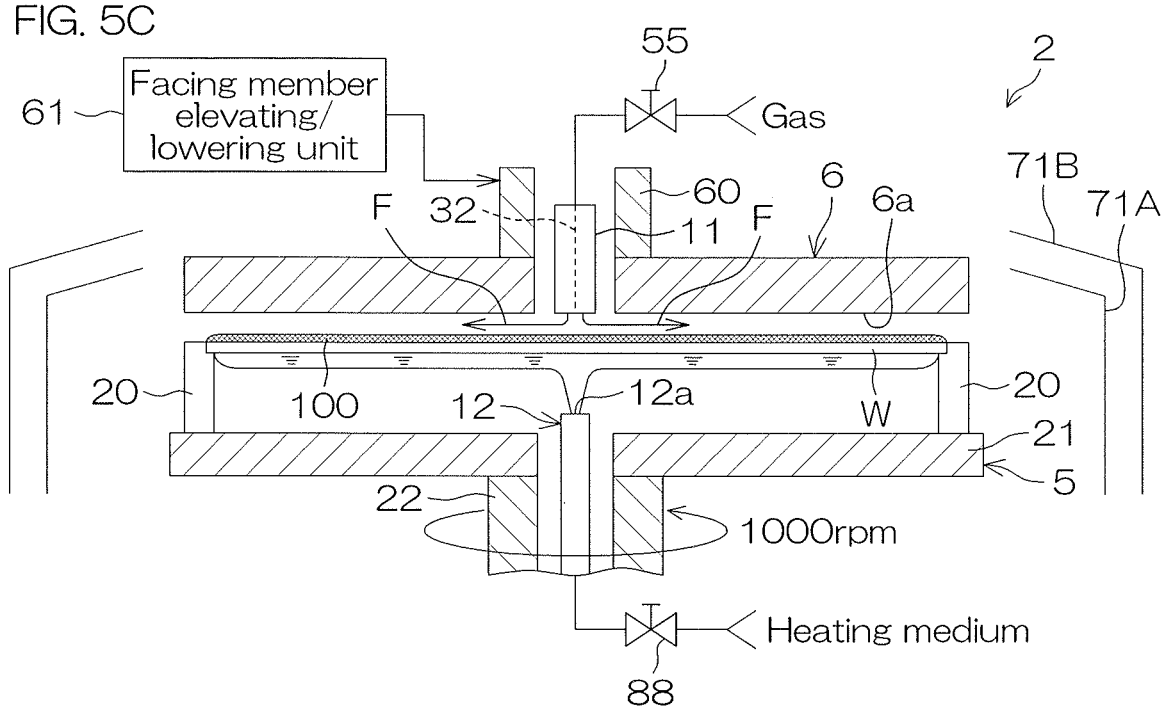
FIG. 5C is a schematic view for describing conditions of a heating step (Step S7) in the substrate processing.

In the processing film forming step, a spin off step (film thinning step) (Step S6) is executed until formation of the processing film 100 (refer to FIG. 5C). In the spin off step, the processing liquid valve 51 is first closed. Thereby, as shown in FIG. 5B, supply of the processing liquid to the substrate W is stopped. Then, the second moving nozzle 9 is moved to the home position by the second nozzle moving unit 37.

In the spin off step, in a state where supply of the processing liquid to the upper surface of the substrate W is stopped, the processing liquid is partially eliminated from the upper surface of the substrate W due to a centrifugal force such that a thickness of the processing liquid film 101 on the substrate W becomes an appropriate thickness. In the spin off step, the facing member 6, the first guard 71A and the second guard 71B are kept at the upper position.

In the spin off step, the spin motor 23 accelerates rotation of the substrate W to change the rotational speed of the substrate W to a predetermined second rotational speed (second rotating step). The second rotational speed is, for example, 1000 rpm to 1500 rpm. In the spin off step, the rotational speed of the substrate W may be kept fixed in a range within 1000 rpm to 1500 rpm or may be changed, whenever necessary, within a range of 1000 rpm to 1500 rpm in the middle of the spin off step. The spin off step is executed for a predetermined time, for example, 30 seconds.

In the processing film forming step, there is executed the heating step (Step S7) in which the substrate W is heated after the spin off step. In the heating step, in order to partially volatilize (evaporate) a solvent of the processing liquid on the substrate W, the processing liquid film 101 (refer to FIG. 5B) on the substrate W is heated.

Referring to FIG. 5C, specifically, the facing member elevating/lowering unit 61 moves the facing member 6 to a proximity position between the upper position and the lower position. The proximity position may be the lower position. The proximity position is such a position that a distance from the upper surface of the substrate W to the facing surface 6a is, for example, 1 mm. In the heating step, the first guard 71A and the second guard 71B are kept at the upper position.

Then, the gas valve 55 is opened. Thereby, a gas is supplied to a space between the upper surface of the substrate W (the upper surface of the processing liquid film 101) and the facing surface 6a of the facing member 6 from the central nozzle 11 (the gas supplying step). Thereby, evaporation of the solvent in the processing liquid film 101 is promoted (the solvent evaporating step, the solvent evaporation promoting step). Therefore, time necessary for forming the processing film 100 can be reduced. The central nozzle 11 functions as an evaporating unit (an evaporation promoting unit) for evaporating the solvent in the processing liquid.

Then, the heating medium valve 88 is opened. Thereby, a heating medium is supplied (discharged) from the lower surface nozzle 12 toward the central region on the lower surface of the substrate W in the rotating state (the heating medium supplying step, the heating medium discharging step). The heating medium supplied from the lower surface nozzle 12 to the lower surface of the substrate W spreads radially by being subjected to a centrifugal force and extends across the entire lower surface of the substrate W. Supply of the heating medium to the substrate W continues for a predetermined time, for example, 60 seconds. In the heating step, the substrate W is rotated at a predetermined heating rotational speed, for example, 1000 rpm.

The heating medium is supplied to the lower surface of the substrate W, so that the processing liquid film 101 on the substrate W is heated via the substrate W. Thereby, evaporation of the solvent in the processing liquid film 101 is promoted (the solvent evaporating step, the solvent evaporation promoting step). Therefore, time necessary for forming the processing film 100 can be reduced. The lower surface nozzle 12 functions as an evaporating unit (an evaporation promoting unit) for evaporating the solvent in the processing liquid.

The spin off step and the heating step are executed, so that the processing liquid is solidified or cured to form the processing film 100 on the substrate W. As described above, the substrate rotating unit (the spin motor 23) and the lower surface nozzle 12 are included in a solid forming unit which solidifies and cures the processing liquid to form a solid (the processing film 100). It is noted that the thickness of the processing film 100 is much thinner than the thickness of the substrate W. However, in FIG. 5C, for convenience of description, the thickness of the processing film 100 is depicted in an exaggerated manner (so as to be similar to the thickness of the substrate W) (The same will also apply to FIG. 5D and FIG. 5E).

In the heating step, it is preferable that the substrate W is heated such that a temperature of the processing liquid on the substrate W is lower than a boiling point of the solvent. The processing liquid is heated at a temperature lower than a boiling point of the solvent, so that the solvent can be made to remain appropriately in the processing film 100. Thereby, the peeling liquid is made to conform with the processing film 100 more easily in the subsequent removing step (Step S9) by interaction of the solvent remaining in the processing film 100 with the peeling liquid than a case in which no solvent remains in the processing film 100. Therefore, the processing film 100 is made easily peelable by the peeling liquid.

The heating medium splashed outside the substrate W due to a centrifugal force is received by the first guard 71A. There is a case in which the heating medium received by the first guard 71A may be splashed back from the first guard 71A. However, since the facing member 6 is kept close to the upper surface of the substrate W, the upper surface of the substrate W can be protected from the heating medium splashed back from the first guard 71A. Consequently, since it is possible to suppress attachment of the heating medium to an upper surface of the processing film 100, occurrence of particles resulting from the heating medium splashed back from the first guard 71A can be suppressed.

Further, a gas is supplied from the central nozzle 11 to form a gas stream F which moves from the central region on the upper surface of the substrate W toward a peripheral edge of the upper surface of the substrate W at a space between the facing surface 6a of the facing member 6 and the upper surface of the substrate W. The gas stream F which moves from the central region on the upper surface of the substrate W toward the peripheral edge of the upper surface of the substrate W is formed, so that the heating medium splashed back from the first guard 71A can be pushed back toward the first guard 71A. Consequently, it is possible to further suppress attachment of the heating medium to the upper surface of the processing film 100.

Next, the buffering step (Step S8) is executed. Specifically, the heating medium valve 88 is closed. Thereby, supply of the heating medium to the lower surface of the substrate W is stopped. Then, the gas valve 55 is closed. Thereby, supply of a gas to a space between the facing surface 6a of the facing member 6 and the upper surface of the substrate W is stopped.

Figure 5D:
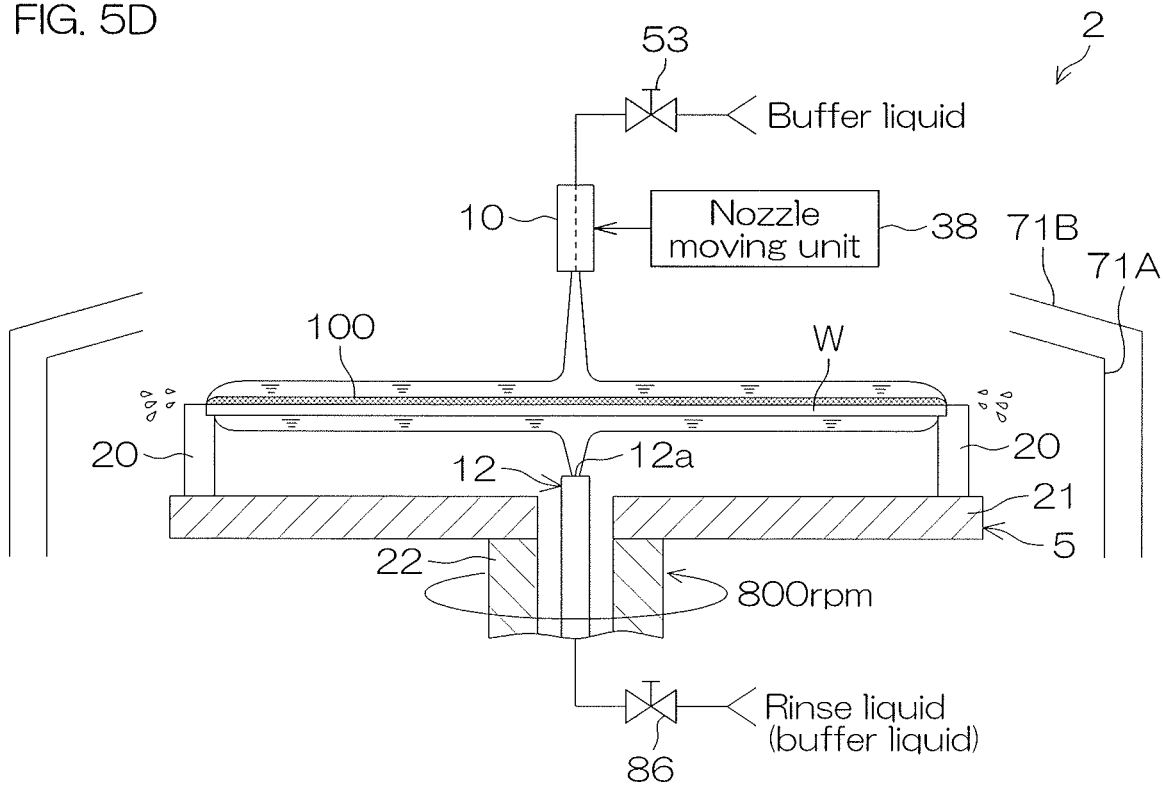
FIG. 5D is a schematic view for describing conditions of a buffering step (Step S8) in the substrate processing.

Then, the facing member elevating/lowering unit 61 moves the facing member 6 to the upper position. Then, as shown in FIG. 5D, the third nozzle moving unit 38 moves the third moving nozzle 10 to a processing position. The processing position of the third moving nozzle 10 is, for example, the central position. In the buffering step, the substrate W is rotated at a predetermined buffering rotational speed, for example, 800 rpm.

Then, the upper buffer liquid valve 53 is opened. Thereby, a buffer liquid is supplied (discharged) from the third moving nozzle 10 toward the central region on the upper surface of the substrate W in the rotating state (the buffer liquid supplying step, the buffer liquid discharging step). The buffer liquid supplied to the upper surface of the substrate W spreads across the entire upper surface of the substrate W due to a centrifugal force. Supply of the buffer liquid to the upper surface of the substrate W continues for a predetermined time, for example, 60 seconds.

In a case where the peeling liquid which is supplied to the substrate W in the next removing step (Step S9) is high in concentration, in particular, at the start of supplying the peeling liquid, the peeling liquid may act locally on the upper surface of the substrate W. Thus, the buffer liquid is supplied to the upper surface of the substrate W before supply of the peeling liquid, thus making it possible to buffer actions of the peeling liquid on the processing film 100. It is, thereby, possible to avoid acting locally on the peeling liquid on the upper surface of the substrate W. Thus, the peeling liquid can be uniformly applied to the entire upper surface of the substrate W.

Next, the removing step (Step S9) is executed. In the removing step, the substrate W is rotated at a predetermined removing rotational speed, for example, 800 rpm.

Figure 5E:
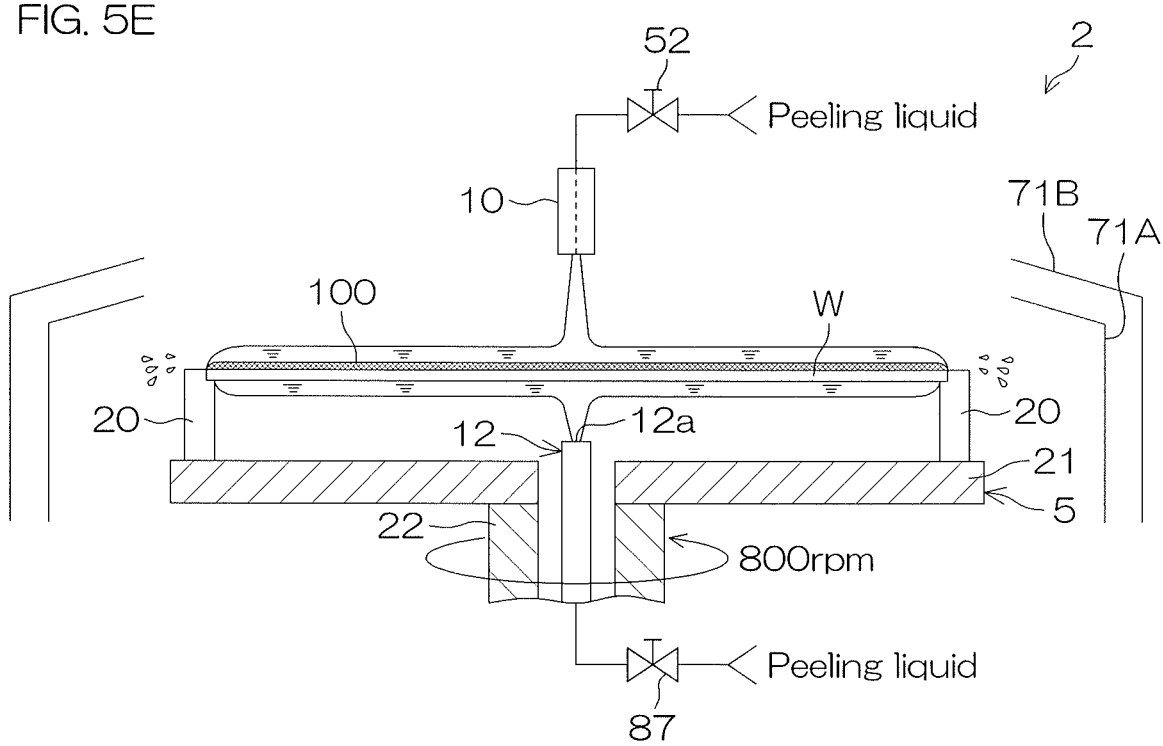
FIG. 5E is a schematic view for describing conditions of a removing step (Step S9) in the substrate processing.

Then, the upper buffer liquid valve 53 is closed. Thereby, supply of the buffer liquid to the upper surface of the substrate W is stopped. Then, as shown in FIG. 5E, the upper peeling liquid valve 52 is opened. Thereby, the peeling liquid is supplied (discharged) from the third moving nozzle 10 toward the central region on the upper surface of the substrate W in the rotating state (the upper peeling liquid supplying step, the upper peeling liquid discharging step). The peeling liquid supplied to the upper surface of the substrate W spreads across the entire upper surface of the substrate W due to a centrifugal force. Supply of the peeling liquid to the upper surface of the substrate W continues for a predetermined time, for example, 60 seconds.

The peeling liquid is supplied to the upper surface of the substrate W, so that the processing film 100 is peeled from the upper surface of the substrate W. When peeled from the upper surface of the substrate W, the processing film 100 is split into film fragments. Then, the split film fragments of the processing film 100 are subjected to a centrifugal force due to rotation of the substrate W and eliminated outside the substrate W, together with the peeling liquid. Thereby, a removal object is removed from the upper surface of the substrate W together with the processing film 100.

Here, there is a case in which the processing liquid supplied to the upper surface of the substrate W in the processing liquid supplying step (Step S5) shown in FIG. 5A may follow a peripheral edge of the substrate W to reach the lower surface of the substrate W. There is also a case in which the processing liquid splashed from the substrate W may be splashed back from the first guard 71A to attach on the lower surface of the substrate W. Even in these cases, as shown in FIG. 5C, in the heating step (Step S7), a heating medium is supplied to the lower surface of the substrate W. It is, thus, possible to eliminate the processing liquid from the lower surface of the substrate W due to a flow of the heating medium.

There is also a case in which the processing liquid attached to the lower surface of the substrate W may be solidified or cured to form a solid due to the processing liquid supplying step (Step S5). Even in this case, as shown in FIG. 5E, while the peeling liquid is supplied to the upper surface of the substrate W in the removing step (Step S9), the lower peeling liquid valve 87 is opened to supply (discharge) the peeling liquid from the lower surface nozzle 12 to the lower surface of the substrate W, thus making it possible to peel the solid from the lower surface of the substrate W (the lower peeling liquid supplying step, the lower peeling liquid discharging step).

Further, as shown in FIG. 5D, while the buffer liquid is supplied to the upper surface of the substrate W in the buffering step (Step S8), the lower rinse liquid valve 86 is opened to supply (discharge) the rinse liquid as the buffer liquid from the lower surface nozzle 12 to the lower surface of the substrate W. Thereby, it is possible to buffer actions of the peeling liquid supplied to the lower surface of the substrate W (the lower buffer liquid supplying step, the lower buffer liquid discharging step).

Figure 5F:
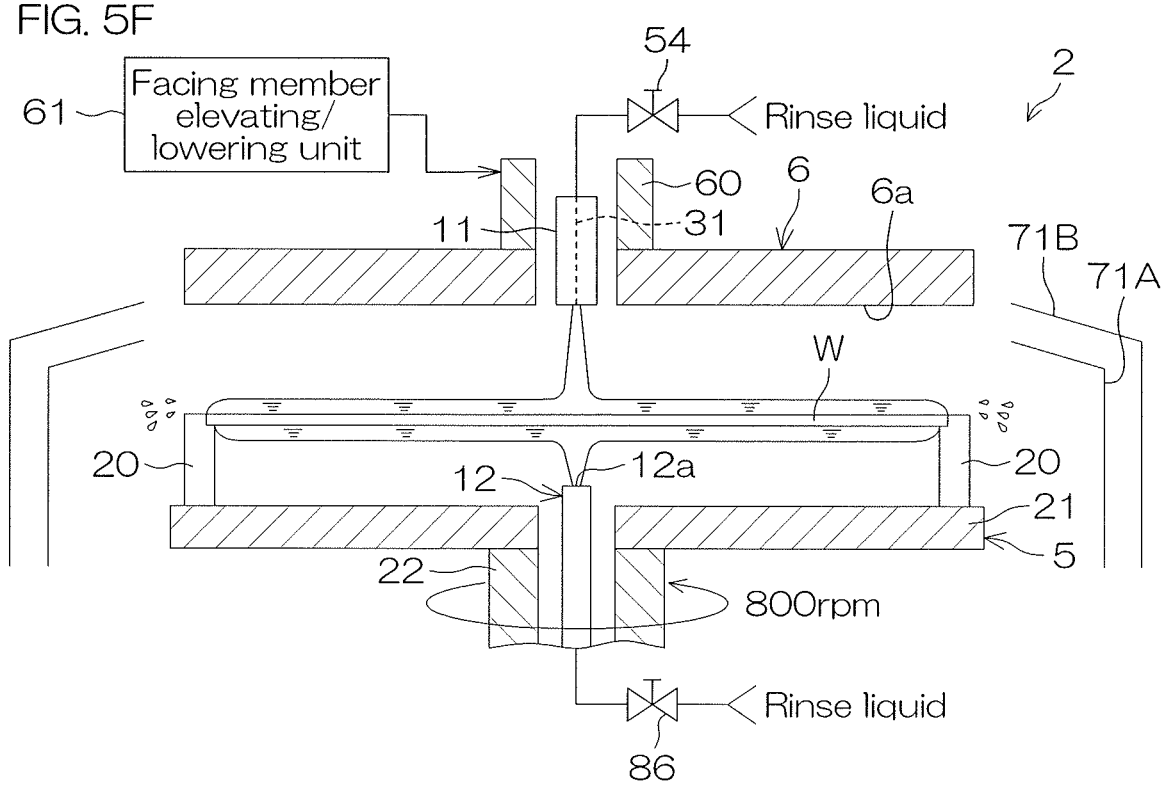
FIG. 5F is a schematic view for describing conditions of a second rinsing step (Step S10) in the substrate processing.

Next, the second rinsing step (Step S10) is executed. Specifically, the upper peeling liquid valve 52 and the lower peeling liquid valve 87 are closed. Thereby, supply of the peeling liquid to the upper surface and the lower surface of the substrate W is stopped. Then, the third nozzle moving unit 38 moves the third moving nozzle 10 to the home position. Then, as shown in FIG. 5F, the facing member elevating/lowering unit 61 moves the facing member 6 to the processing position. In the second rinsing step, the substrate W is rotated for a predetermined second rinse rotational speed, for example, 800 rpm. The first guard 71A and the second guard 71B are kept at the upper position.

Then, the upper rinse liquid valve 54 is opened. Thereby, the rinse liquid is supplied (discharged) from the central nozzle 11 to the central region on the upper surface of the substrate W in the rotating state (the second upper rinse liquid supplying step, the second upper rinse liquid discharging step). The rinse liquid supplied to the upper surface of the substrate W spreads radially by being subjected to a centrifugal force and extends across the entire upper surface of the substrate W. Thereby, the peeling liquid attached to the upper surface of the substrate W is washed away with the rinse liquid.

Then, the lower rinse liquid valve 86 is opened. Thereby, the rinse liquid is supplied (discharged) from the lower surface nozzle 12 toward the central region on the lower surface of the substrate W in the rotating state (the second lower rinse liquid supplying step, the second lower rinse liquid discharging step). Thereby, the peeling liquid attached to the lower surface of the substrate W is washed away with the rinse liquid. Supply of the rinse liquid to the upper surface and the lower surface of the substrate W continues for a predetermined time, for example, 35 seconds.

Figure 5G:
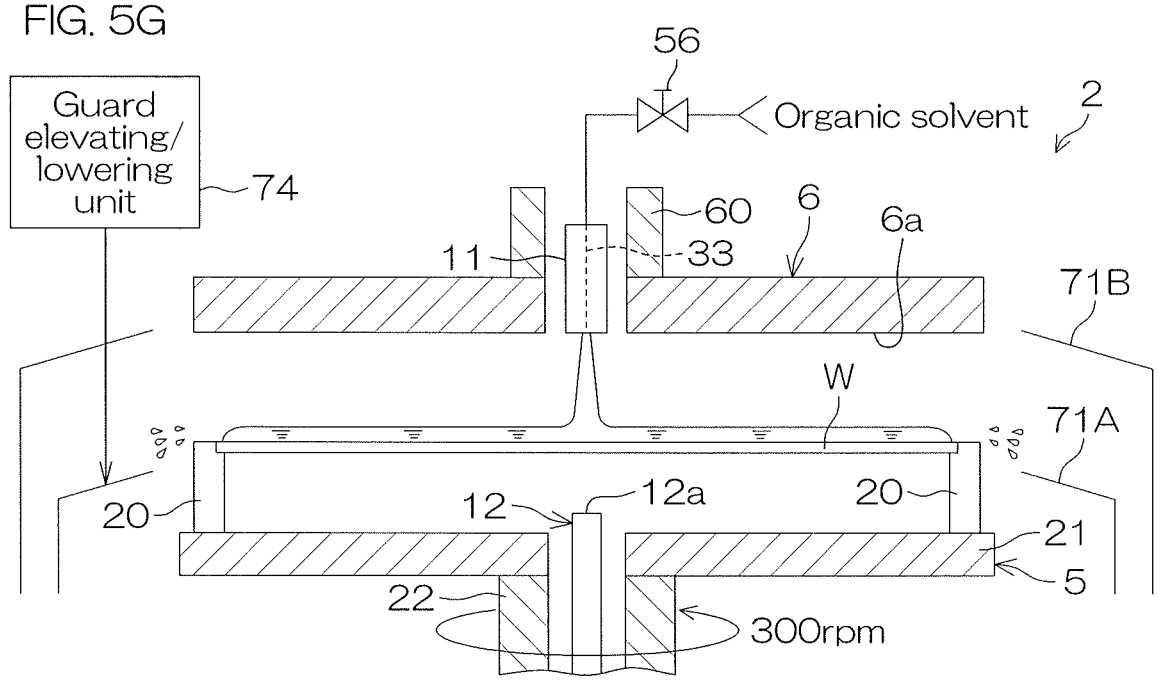
FIG. 5G is a schematic view for describing conditions of a second organic solvent supplying step (Step S11) in the substrate processing.

Next, the second organic solvent supplying step (Step S11) is executed. Specifically, as shown in FIG. 5G, the guard elevating/lowering unit 74 moves the first guard 71A to the lower position. Then, the facing member 6 is kept at the processing position. In the second organic solvent supplying step, the substrate W is rotated at a predetermined second organic solvent rotational speed, for example, 300 rpm.

Then, the upper rinse liquid valve 54 and the lower rinse liquid valve 86 are closed. Thereby, supply of the rinse liquid to the upper surface and the lower surface of the substrate W is stopped. Then, as shown in FIG. 5G, the organic solvent valve 56 is opened. Thereby, the organic solvent is supplied (discharged) from the central nozzle 11 toward the central region on the upper surface of the substrate W in the rotating state (the second organic solvent supplying step, the second organic solvent discharging step, the residue removing liquid supplying step). Supply of the organic solvent to the upper surface of the substrate W continues for a predetermined time, for example, 30 seconds.

The organic solvent supplied to the upper surface of the substrate W spreads radially by being subjected to a centrifugal force and extends across the entire upper surface of the substrate W. Thereby, the rinse liquid on the upper surface of the substrate W is replaced with the organic solvent. The organic solvent supplied to the upper surface of the substrate W is removed from a peripheral edge of the upper surface of the substrate W after dissolution of residue of the processing film 100 remaining on the upper surface of the substrate W (the residue removing step).

Figure 5H:
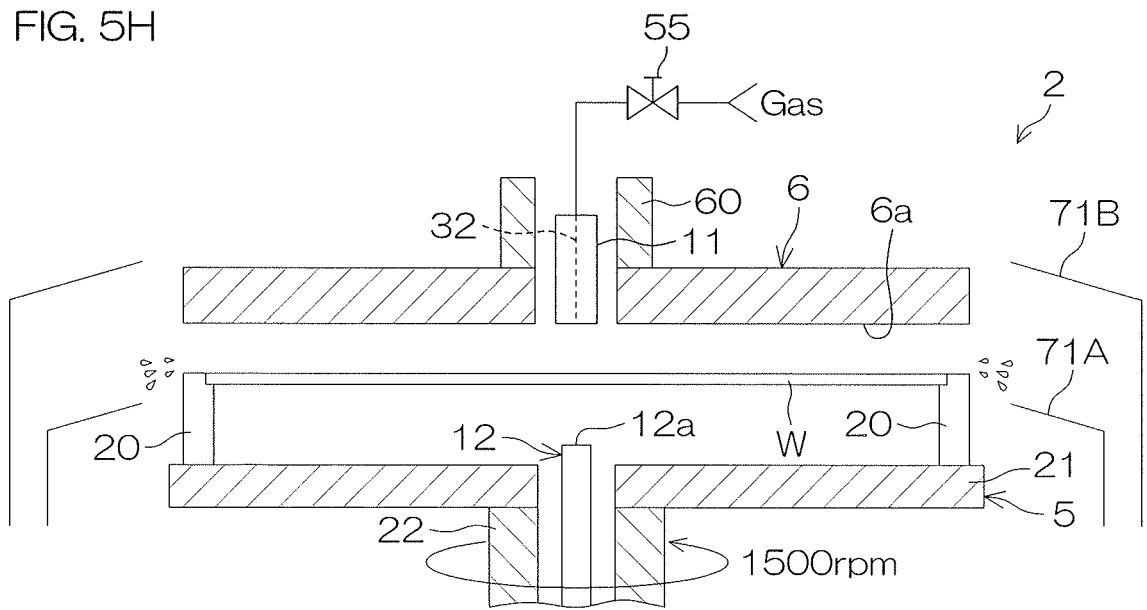
FIG. 5H is a schematic view for describing conditions of a spin drying step (Step S12) in the substrate processing.

Next, the spin drying step (Step S12) is executed. Specifically, the organic solvent valve 56 is closed. Thereby, supply of the organic solvent to the upper surface of the substrate W is stopped. Then, as shown in FIG. 5H, the facing member elevating/lowering unit 61 moves the facing member 6 to a drying position lower than the processing position. When the facing member 6 is positioned at the drying position, a distance between the facing surface 6a of the facing member 6 and the upper surface of the substrate W is, for example, 1.5 mm. Then, the gas valve 55 is opened. Thereby, a gas is supplied to a space between the upper surface of the substrate W and the facing surface 6a of the facing member 6.

Then, the spin motor 23 accelerates rotation of the substrate W to rotate the substrate W at a high speed. The substrate W is rotated at a drying speed, for example, 1500 rpm in the spin drying step. The spin drying step is executed for a predetermined time, for example, 30 seconds. Thereby, a great centrifugal force is applied to the organic solvent on the substrate W, so that the organic solvent on the substrate W is scattered around the substrate W. In the spin drying step, a gas is supplied to a space between the upper surface of the substrate W and the facing surface 6a of the facing member 6 to promote evaporation of the organic solvent.

Then, the spin motor 23 stops rotation of the substrate W. The guard elevating/lowering unit 74 moves the first guard 71A and the second guard 71B to the lower position. The gas valve 55 is closed. The facing member elevating/lowering unit 61 moves the facing member 6 to the upper position.

The transfer robot CR enters into the processing unit 2, lifts up a processed substrate W from the chuck pin 20 of the spin chuck 5 and carries it outside the processing unit 2 (Step S13). The substrate W is transferred from the transfer robot CR to the transfer robot IR and housed in a carrier C by the transfer robot IR.

Figure 6:
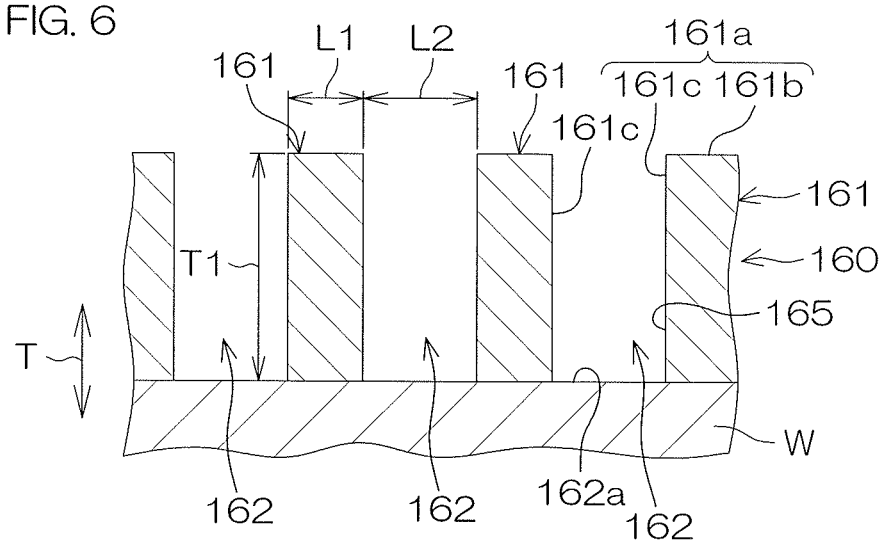
FIG. 6 is a schematic sectional view for describing one example of a structure of a patterned surface of a substrate which is processed by the substrate processing apparatus.

As shown in FIG. 6, the fine pattern 160 with projections and recesses is formed on the upper surface of the substrate W in which the substrate processing is executed. The pattern 160 with projections and recesses includes a fine projected structure body 161 formed on the upper surface of the substrate W and a recessed portion (groove) 162 formed between adjacent structure bodies 161.

The surface of the pattern 160 with projections and recesses, that is, the surface 161a of the structure body 161 (projected portion) and the surface of the recessed portion 162 form an patterned surface 165 with projections and recesses (uneven patterned surface). The surface 161a of the structure body 161 is configured with a leading end surface 161b (top portion) and a side surface 161c, and the surface of the recessed portion 162 is configured with a bottom surface 162a (bottom portion). In a case where the structure body 161 is tubular, a recessed portion is to be formed in the interior thereof.

The structure body 161 may include an insulator film or may include a conductor film. The structure body 161 may be a stacked layer in which a plurality of films are stacked.

The pattern 160 with projections and recesses is a fine pattern with an aspect ratio of 3 or more. The uneven pattern 160 is, for example, 10 to 50 in aspect ratio. The structure body 161 may be approximately 10 nm to 45 nm in width L1 and may be approximately 10 nm to several micrometers in interval L2 between the structure bodies 161. The structure body 161 may be, for example, approximately 50 nm to 5 μm in height (pattern height T1). The pattern height T1 is a distance between the leading end surface 161b of the structure body 161 and the bottom surface 162a (bottom portion) of the recessed portion 162.

Figure 7A:
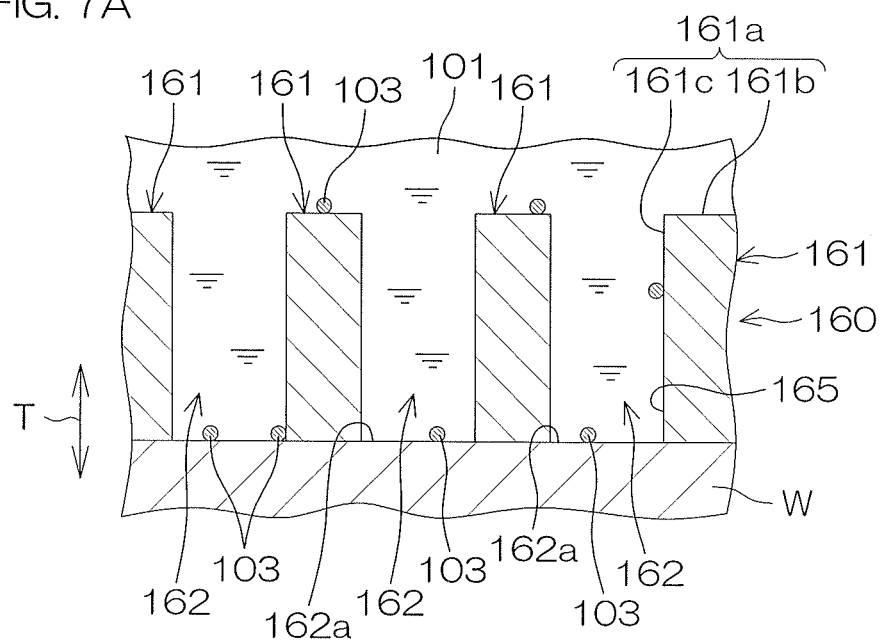
FIG. 7A is a schematic sectional view for describing conditions in the vicinity of the patterned surface after the processing liquid supplying step (Step S5).
Figure 7B:
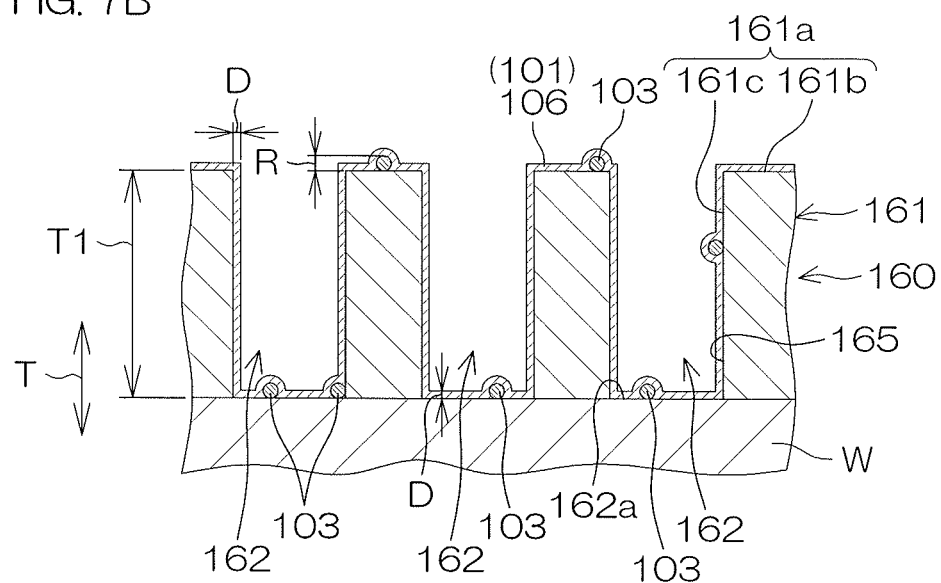
FIG. 7B is a schematic sectional view for describing conditions in the vicinity of the patterned surface after the spin off step (Step S6).
Figure 7C:
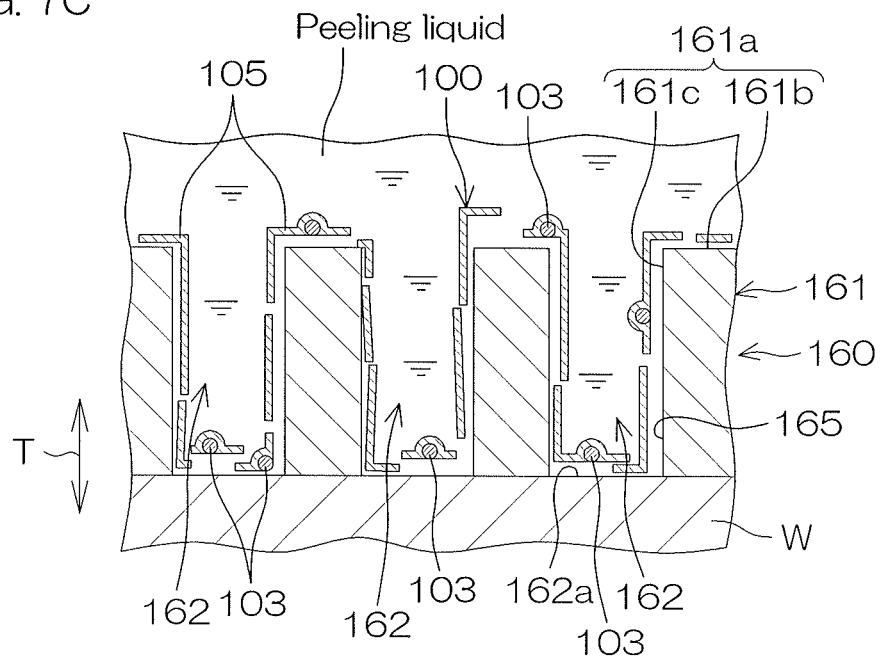
FIG. 7C is a schematic sectional view for describing conditions in the vicinity of the patterned surface while execution of the removing step (Step S9) is in progress.

Next, with reference to FIG. 7A to FIG. 7C, a description will be given of conditions under which the processing film 100 is formed on the patterned surface 165 and conditions under which the processing film 100 is peeled from the patterned surface 165. FIG. 7A shows conditions of the substrate W in the vicinity of the patterned surface 165 after the processing liquid supplying step (Step S5). FIG. 7B shows conditions of the substrate W in the vicinity of the patterned surface 165 after the spin off step (Step S6). FIG. 7C shows conditions of the substrate W in the vicinity of the patterned surface 165 while execution of the removing step (Step S9) is in progress.

In the processing liquid supplying step (Step S5) which is executed before the spin off step, the substrate W is rotated at the first rotational speed which is a relatively low speed (the first rotating step). Therefore, as shown in FIG. 7A, before the processing liquid is shaken off from the patterned surface 165, the processing liquid enters into a recessed portion 162 of the pattern 160 with projections and recesses due to its own weight and the recessed portion 162 is filled with the processing liquid (the processing liquid filling step).

In the spin off step, the substrate W is rotated at the second rotational speed which is faster than the first rotational speed (the second rotating step). Therefore, in a state where the processing liquid has fully entered into a bottom portion of the recessed portion 162 of the pattern 160 with projections and recesses, the processing liquid film 101 on the substrate W is thinned. When the processing liquid film 101 is thinned, the solvent undergoes volatilization (evaporation), so that, as shown in FIG. 7B, the processing liquid film 101 is changed into a thin semi-solid state film 106 which extends following (along) the pattern 160 with projections and recesses. Then, in the heating step (Step S7), the semi-solid state film 106 (the processing liquid film 101) is heated, by which the solvent inside the semi-solid state film 106 (processing liquid film 101) undergoes further volatilization (evaporation), thereby formation of the processing film 100 (the processing film forming step) is completed.

The processing film 100 covers a removal object 103 present on the front surface (that is, the patterned surface 165) of the pattern 160 with projections and recesses. Adhesion of the processing film 100 to the removal object 103 is larger than adhesion of the removal object 103 to the pattern 160 with projections and recesses. Therefore, the processing film 100 is able to firmly hold the removal object 103.

The film thickness D of the processing film 100 is thinner than the pattern height T1 in the thickness direction T of the substrate W. The film thickness D of a portion of the processing film 100 which follows the bottom surface 162a of the recessed portion 162 and the leading end surface 161b of the structure body 161 is a width of the processing film 100 in the thickness direction T of the substrate W. The film thickness D of a portion of the processing film 100 which follows the side surface 161c of the structure body 161 is a width of the processing film 100 of the substrate W in a direction orthogonal to the thickness direction T. In a recessed portion 162, the surface (upper surface) of the processing film 100 is positioned further on the side of the bottom surface 162a than the leading end surface 161b (top portion) of the structure body 161 (projected portion) adjacent to the recessed portion 162.

Then, with reference to FIG. 7C, a peeling liquid is supplied to the patterned surface 165 of the substrate W in the removing step, so that the peeling liquid penetrates through the processing film 100 to act on an interface between the processing film 100 and the patterned surface 165. The processing film 100 is split into film fragments 105 due to energy received from the peeling liquid flowing on the substrate W. The film fragments 105 of the processing film 100 are peeled from the patterned surface 165, in a state where the removal object 103 is held, due to actions of the peeling liquid (the processing film splitting step, the peeling step). Then, the removal object 103 is pushed outside the substrate W together with the processing film 100 in a state of being held by the processing film 100 and removed from the substrate W.

Figure 8A:
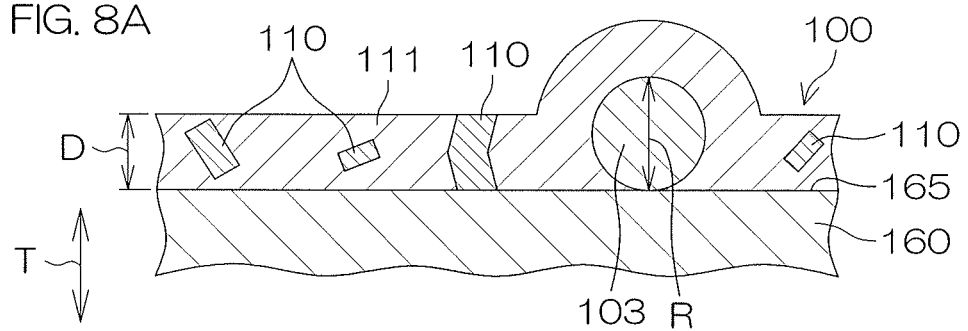
FIG. 8A is a schematic sectional view for describing conditions inside the processing film after the heating step (Step S7).
Figure 8B:
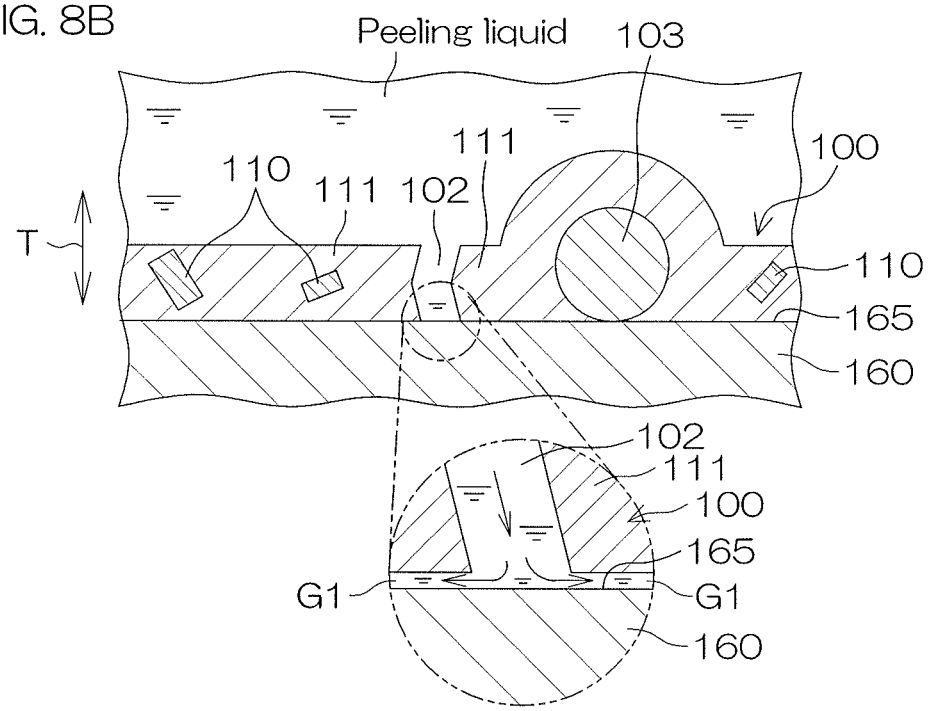
FIG. 8B is a schematic sectional view for describing conditions inside the processing film while execution of the removing step (Step S9) is in progress.
Figure 8C:
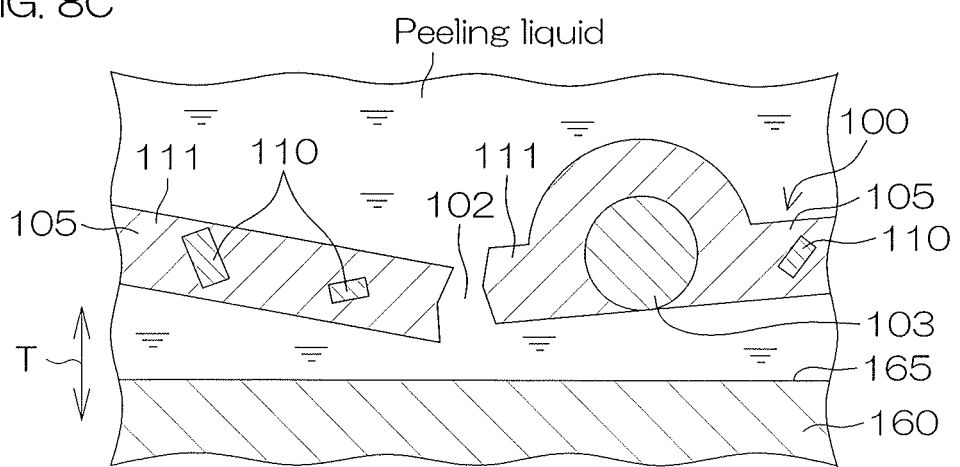
FIG. 8C is a schematic sectional view for describing conditions inside the processing film while execution of the removing step (Step S9) is in progress.

Next, with reference to FIG. 8A to FIG. 8C, a description will be given of conditions in the interior of the processing film 100 when the processing film 100 is peeled from the substrate W. FIG. 8A shows conditions inside the processing film 100 after the heating step (Step S7) and before the start of the buffering step (Step S8). FIG. 8B and FIG. 8C show conditions inside the processing film 100 while execution of the removing step (Step S9) is in progress.

As shown in FIG. 8A, the processing film 100 formed by heating the substrate W has a first solid 110 formed by the first component which is contained in the solute of the processing liquid and a second solid 111 formed by the second component which is contained in the solute of the processing liquid.

With reference to FIG. 8B, the peeling liquid is supplied to the upper surface of the substrate W in the removing step, so that the first solid 110 formed by the first component higher in solubility in the peeling liquid than the second component is mainly dissolved. Thereby, a penetrating hole 102 is formed at a portion of the processing film 100 at which the first solid 110 is locally present (the penetrating hole forming step). The penetrating hole 102 is likely to be formed in particular at a portion of the processing film 100 in which the first solid 110 extends in the thickness direction. The penetrating hole 102 is, for example, several nanometers in diameter in a plan view.

The peeling liquid dissolves not only the first solid 110 but also the second solid 111. However, since the second component is lower in solubility in the peeling liquid than the first component, the second solid 111 in the vicinity of the front surface is only slightly dissolved by the peeling liquid.

Therefore, the peeling liquid which has reached the vicinity of the patterned surface 165 via the penetrating hole 102 slightly dissolves a portion of the second solid 111 in the vicinity of the patterned surface 165. Thereby, as shown in an enlarged view of FIG. 8B, while gradually dissolving the second solid 111 in the vicinity of the patterned surface 165, the peeling liquid enters into a gap G1 between the processing film 100 and the patterned surface 165 (the peeling liquid entry step).

Then, for example, with a peripheral edge of the penetrating hole 102 given as a starting point, the processing film 100 is split into the film fragments 105. As shown in FIG. 8C, the film fragment 105 of the processing film 100 is peeled from the patterned surface 165, in a state where the removal object 103 is held.

There can be found a case in which the peeling liquid hardly dissolves the second solid 111. Even in this case, the peeling liquid enters into the narrow gap G between the processing film 100 and the upper surface of the substrate W, so that the processing film 100 is peeled from the substrate W.

According to the present preferred embodiment, in the processing film forming step (Step S6 and Step S7), the processing film 100 is formed so as to follow the uneven pattern 160 with projections and recesses (the patterned surface 165 with projections and recesses) which forms the patterned surface 165. Therefore, the processing film 100 can be reduced in film thickness D in the entire patterned surface 165. Consequently, the peeling liquid can easily pass through the processing film 100 in the entire patterned surface 165 and easily reach an interface between the processing film 100 and the patterned surface 165.

Further, the processing film 100 is reduced in film thickness D to reduce the strength of the processing film 100. Therefore, the processing film 100 is easily split into the film fragments 105 due to energy received from the peeling liquid flowing on the patterned surface 165. Consequently, the peeling liquid is able to smoothly reach an interface between the processing film 100 and the patterned surface 165 from among the split film fragments 105.

The peeling liquid is made to smoothly reach an interface between the processing film 100 and the patterned surface 165 in the entire patterned surface 165, thus making it possible to efficiently peel a removal object 103 from the patterned surface 165 together with the processing film 100. As a result, the removal object 103 can be efficiently removed from the substrate W.

Further, according to the present preferred embodiment, the film thickness D of the processing film 100 formed in the processing film forming step is thinner than the height of the projections and the recesses of the patterned surface 165 (pattern height T1) in the thickness direction T of the substrate W. Therefore, it is possible to reduce a distance between the surface of the processing film 100 and the patterned surface 165 in the thickness direction T. Consequently, the peeling liquid can be made to smoothly reach an interface between the patterned surface 165 and the processing film 100. As a result, it is possible to more efficiently peel the removal object 103 from the patterned surface 165 together with the processing film 100.

According to the present preferred embodiment, in the processing film forming step, the processing film 100 is formed such that, in the interior of a recessed portion 162, the front surface of the processing film 100 is positioned further on the side of the bottom surface 162a (bottom portion) of the recessed portion 162 than the top portion of the structure body 161 (projected portion) adjacent to the recessed portion 162. Therefore, in the processing film forming step, the film thickness D of the processing film 100 (a distance between the bottom surface 162a and the surface of the processing film 100) in the interior of the recessed portion 162 can be reduced as compared with a case in which the processing film 100 is formed so as to fill up an entire interior of the recessed portion 162. Consequently, the peeling liquid can be made to smoothly reach an interface between the bottom surface 162a of the recessed portion 162 of the patterned surface 165 and the processing film 100. As a result, it is possible to more efficiently remove a removal object 103 from the pattern 160 with projections and recesses, together with the processing film 100.

According to the present preferred embodiment, in the processing film forming step, the processing film 100 is formed so as to cover the removal object 103. Thereby, the contact area of the processing film 100 and the removal object 103 can be increased, so that a holding force that the processing film 100 holds the removal object 103 can be improved. Therefore, it is possible to reduce removal objects 103 falling off from the processing film 100. Consequently, most of the removal objects 103 can be removed from a substrate W together with the processing film 100 to eliminate the removal object 103 efficiently outside the substrate W, while reattachment of the removal object 103 to the substrate W is suppressed.

According to the present preferred embodiment, in the processing film forming step, the processing film 100 is formed such that adhesion of the processing film 100 to the removal object 103 can be larger than adhesion of the removal object 103 to the substrate W. Therefore, when the processing film 100 is peeled by the peeling liquid from the patterned surface 165, it is possible to reduce the number of the removal objects 103 remaining on the patterned surface 165 without being peeled away from the patterned surface 165. Consequently, most of the removal objects 103 can be removed from the substrate W together with the processing film 100 to efficiently eliminate the removal object 103 outside the substrate W.

According to the present preferred embodiment, in the removing step (Step S9), the first solid 110 is dissolved by the peeling liquid, that is, the processing film 100 is partially dissolved to form a penetrating hole 102 in the processing film 100 (the penetrating hole forming step).

Therefore, the peeling liquid is able to smoothly reach an interface between the processing film 100 and the patterned surface 165 via the penetrating hole 102. Consequently, the peeling liquid is made to act on an interface between the processing film 100 and the patterned surface 165, thus making it possible to efficiently peel the removal object 103 from the patterned surface 165 together with the processing film 100.

On the other hand, although the processing film 100 is partially dissolved by the peeling liquid for formation of the penetrating hole 102, a remaining portion of the processing film 100 (the second solid 111) is kept in a solid state. Consequently, the processing film 100 which forms the penetrating hole 102 and also holds the removal object 103 can be peeled from the patterned surface 165. As a result, it is possible to efficiently remove the removal object 103 from the patterned surface 165 together with the processing film 100.

According to the present preferred embodiment, in the removing step, the peeling liquid enters between the processing film 100 and the patterned surface 165 via the penetrating hole 102 (the peeling liquid entry step). Therefore, the peeling liquid is made to act on an interface between the processing film 100 and the patterned surface 165, thus making it possible to more efficiently peel the processing film 100 from the patterned surface 165.

According to the present preferred embodiment, the processing film 100 formed in the processing film forming step has the first solid 110 formed by the first component and the second solid 111 formed by the second component. The first component is higher in solubility in the peeling liquid than the second component and, therefore, the first solid 110 is more easily dissolved in the peeling liquid than the second solid 111.

Therefore, while the peeling liquid is used to dissolve the first solid 110 and reliably form the penetrating hole 102, the second solid 111 can be kept in a solid state with the second solid 111 hardly dissolved in the peeling liquid. Consequently, the peeling liquid can be made to act on an interface between the second solid 111 and the patterned surface 165, in a state where a removal object 103 is held by the second solid 111.

As a result, it is possible to smoothly peel the removal object 103 from the patterned surface 165 together with the processing film 100 and also efficiently remove the removal object 103 from the patterned surface 165 together with the processing film 100.

According to the present preferred embodiment, the substrate W is rotated at a first speed until a predetermined timing before formation of the processing film 100 from the start of supplying the processing liquid to the patterned surface 165 (first rotating step). That is, the substrate W is rotated at the first speed which is a relatively low speed until formation of the processing film 100 from the start of supplying the processing liquid to the patterned surface 165. Therefore, before the processing liquid is shaken off due to a centrifugal force and completely reduced in quantity of the processing liquid on the patterned surface 165, the processing liquid enters into the recessed portion 162 of the uneven pattern 160 due to its own weight.

Then, until formation of the processing film 100 after the first rotating step, rotation of the substrate W is accelerated and the substrate W is rotated at a second speed faster than the first speed (second rotating step). The processing liquid is, thereby, eliminated from the patterned surface 165 of the substrate W. Therefore, it is possible to form the processing film 100 which is sufficiently thin in a state where the processing liquid has already entered into the recessed portion 162 of the uneven pattern 160 due to its own weight.

The present invention shall not be limited to the embodiments so far described but may be executed by still other embodiments.

For example, such substrate processing that the chemical liquid supplying step (Step S2), the first rinsing step (Step S3) and the first organic solvent supplying step (Step S4) are omitted may be executed by the substrate processing apparatus 1.

Further, with regard to the substrate processing of the above-described embodiments, in the processing film forming step (Step S6 and Step S7), the substrate W is heated by a heating medium to evaporate the solvent of the processing liquid. However, the substrate W may be heated not only by supply of the heating medium but also, for example, by a heater, etc., (not shown) housed inside the spin base 21 or the facing member 6. In this case, the heater functions as a substrate heating unit and an evaporating unit (an evaporation promoting unit).

Further, formation of the processing film 100 does not necessarily entail heating of the substrate W. That is, in the spin off step (Step S6), in a case where the solvent undergoes sufficient volatilization (evaporation) to attain formation of the processing film 100, no subsequent heating step (Step S7) may be executed. In particular, in a case where the solvent can be made to remain in the interior of the processing film 100, the solvent can be easily evaporated up to a desired extent without heating the substrate W.

Further, in each of the above-described substrate processing, the buffering step (Step S8) may also be omitted.

Further, in each of the above-described substrate processing, the contained amount of the second component in the processing liquid is larger than the contained amount of the first component in the processing liquid. Therefore, a portion of the processing film 100 which is dissolved by the peeling liquid can be reduced as compared with a configuration in which the contained amount of the second component in the processing liquid is smaller than the contained amount of the first component in the processing liquid. Therefore, it is possible to reduce the removal object 103 detached from the processing film 100 in association with partial dissolution of the processing film 100. Consequently, the removal object 103 can be substantially removed from the upper surface of the substrate W, together with the processing film 100. It is, thus, possible to suppress reattachment of the removal object 103 to the substrate W and also efficiently eliminate the removal object 103 outside the substrate W.

However, unlike the above-described embodiment, the contained amount of the second component in the processing liquid may be lower than the contained amount of the first component in the processing liquid. In this case, a portion of the processing film 100 which is dissolved by the peeling liquid can be increased as compared with a configuration in which the contained amount of the second component in the processing liquid is larger than the contained amount of the first component in the processing liquid. Therefore, the processing film 100 can be split into relatively small film fragments 105. Since the processing film 100 is split into relatively small film fragments 105, the film fragments 105 are likely to be lifted by being subjected to a force from a flow of the peeling liquid and easily removed outside a substrate W by the flow of the peeling liquid. Consequently, it is possible to efficiently remove the processing film 100 from the substrate W.

Further, in each of the above-described preferred embodiments, each of the components (the first component and the second component) of the solute contained in the processing liquid is a synthetic resin. However, each of the components of the solute may not be necessarily a synthetic resin. Any components can be used as long as they may be dissolved by the solvent contained in the processing liquid and the first component is higher than the second component in solubility by the peeling liquid. If so, each of the components of the solute may be, for example, a metal or a salt.

Further, as the peeling liquid, an organic solvent such as IPA, etc., can be used. Even in this case, as the first component and the second component contained in the solute of the processing liquid, there can be used a resin similar to that in which a water-based peeling liquid is used as the peeling liquid.

Further, in each of the above-described substrate processing, the solute contained in the processing liquid contains the first component and the second component. However, the solute may be configured so as to contain a single component or may contain three or more components which are mutually different in solubility in the peeling liquid.

Further, with regard to the processing liquid and the peeling liquid described in each of the above-described preferred embodiments, even those which will be described hereinafter provide the same effects as each of the above-described preferred embodiments.

Hereinafter, expressions of "$C_{x-y}$," "$C_x\text{-}C_y$" and "$C_x$" indicate the number of carbons in a molecule or a substituent. For example, $C_{1-6}$ alkyl indicates an alkyl chain (methyl, ethyl, propyl, butyl, pentyl, hexyl, etc.) which has a carbon of one or more to six or less.

Hereinafter, where a polymer has plural types of repeating units, these repeating units undergo copolymerization. Unless otherwise specified, the copolymerization may be any one of alternating copolymerization, random copolymerization, block copolymerization, graft copolymerization and a mixture of them. Where a polymer and a resin are expressed by a structural formula, n, m, etc., which are written together in parentheses indicate a repeating number.

<Processing Liquid>

The processing liquid contains (A) second component which is an insoluble or sparingly soluble solute, (B) first component which is a soluble solute, and (C) solvent. The processing liquid is dropped on a substrate and dried, by which (C) solvent is removed, (A) second component is filmed and remains as a film together with (B) first component on the substrate, and the film is thereafter removed from the substrate by a peeling liquid. (A) second component is preferably insoluble or sparingly soluble in the peeling liquid. Further, (B) first component is preferably soluble in the peeling liquid. The above-described "solute" is not restricted to a state of being dissolved in (C) solvent but may include a suspended state. As one preferable mode, a solute, a component and an additive contained in the processing liquid are dissolved in (C) solvent. A processing liquid which assumes this mode is considered to be embedded excellently or high in film uniformity.

Here, "as a film together with" preferably means to develop a state of being present together in one film and does not mean that they have their own layer separately. One mode of "film formation" is "solidification." The film obtained from the processing liquid may have such hardness that can hold particles and does not require complete removal of (C) solvent (for example, by gasification). The processing liquid gradually contracts in association with volatilization of (C) solvent and forms a film. The description of "remains as the film on the substrate" means that, in relation to an entirety, an extremely small quantity is permitted to be removed (for example: evaporation or volatilization). It is permissible that as compared with an original quantity, for example, 0 to 10 mass % (preferably 0 to 5 mass %, more preferably 0 to 3 mass %, further preferably 0 to 1 mass % and even further preferably 0 to 0.5 mass %) is removed.

It is considered that the film holds particles on the substrate and is removed by being peeled by a peeling liquid, which is, however, free of any intention of restricting the scope of claims or not constrained by any theory. It is also considered that since (B) first component remains on the film, there occurs a portion which serves as the beginning of peeling the film.

<Second Component>

(A) second component contains at least any one of novolac, polyhydroxystyrene, polystyrene, a polyacrylic acid derivative, a polymaleic acid derivative, polycarbonate, a polyvinyl alcohol derivative, a polmethacrylic acid derivative and a copolymer of a combination thereof (A) second component may preferably contain at least any one of novolac, polyhydroxystyrene, a polyacrylic acid derivative, polycarbonate, a polmethacrylic acid derivative and a copolymer of a combination thereof (A) second component may more preferably contain at least any one of novolac, polyhydroxystyrene, polycarbonate and a copolymer of a combination thereof. Novolac may be phenol novolac.

As a matter of course, as (A) second component, the processing liquid may contain one or two or more of combinations of the above-described preferable examples. For example, (A) second component may contain both novolac and polyhydroxystyrene.

(A) second component is dried and formed into a film, and the film is not substantially dissolved by a peeling liquid which will be described later and peeled, with particles held, which is one preferable mode. Such a mode is permissible that (A) second component is only partially dissolved by the peeling liquid.

It is preferable that (A) second component does not contain fluorine and/or silicon and it is more preferable that it contains neither of them.

It is preferable that the copolymerization is random copolymerization or block copolymerization.

As specific examples of (A) second component, the compounds shown individually in Chemical Formula 7 to Chemical Formula 13 given below can be cited, which is, however, free of any intention of restricting the scope of claims.

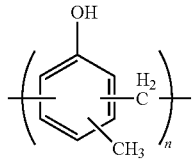

[Chemical Formula 7]

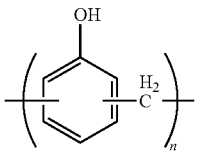

[Chemical Formula 8]

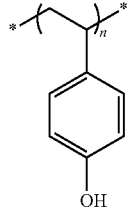

[Chemical Formula 9]

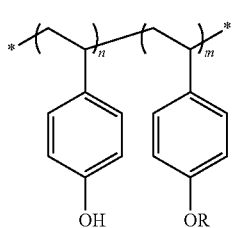

[Chemical Formula 10]

(Here, R indicates a substituent of $C_1$ to $_4$ alkyl, etc.)

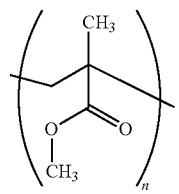

[Chemical Formula 11]

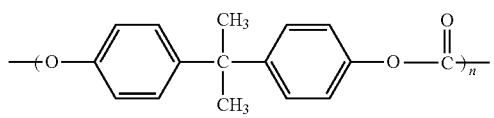

[Chemical Formula 12]

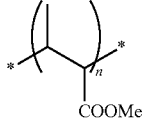

[Chemical Formula 13]

(A) second component is preferably 150 to 500,000 in weight average molecular weight (Mw), more preferably 300 to 300,000, further preferably 500 to 100,000 and even further preferably 1,000 to 50,000.

(A) second component can be obtained by synthesis and can also be purchased. In the case of purchase, for example, each of the following companies can be cited as a supplier. The supplier is also able to synthesize (A) polymer.
Novolac: Showa Kasei Kogyo Co., Ltd., Asahi Yukizai Corp., Gunei Chemical Industry Co., Ltd., Sumitomo Bakelite Co., Ltd.
Polyhydroxystyrene: Nippon Soda Co., Ltd., Maruzen Petrochemical Co., Ltd., Toho Chemical Industry Co., Ltd.
Polyacrylic acid derivative: Nippon Shokubai Co., Ltd.
Polycarbonate: Sigma-Aldrich
Polmethacrylic acid derivative: Sigma-Aldrich As compared with an entire mass of the processing liquid, (A) second component is 0.1 to 50 mass %, preferably 0.5 to 30 mass %, more preferably 1 to 20 mass % and further preferably 1 to 10 mass %. That is, an entire mass of the processing liquid is given as 100 mass %, which is used as a reference to give (A) second component that is 0.1 to 50 mass %. That is, "as compared with" can also be referred to as "which is used as a reference." Unless otherwise specified, this is also applicable to the following.

Solubility can be evaluated by a known method. For example, under conditions of 20° C. to 35° C. (more preferably 25±2° C.), the above-described (A) or (B) which will be described later is added in a quantity of 100 ppm to ammonia water of 5.0 mass % in a flask which is then capped, and a resultant is subjected to 3-hour shaking by using a shaker. Then, the solubility can be determined by whether (A) or (B) is dissolved. Shaking may be agitation. Dissolution can also be judged visually. If (A) or (B) is not dissolved, the solubility is to be less than 100 ppm. If dissolved, the solubility is to be 100 ppm or more. The solubility of less than 100 ppm is to be insoluble or sparingly soluble, and the solubility of 100 ppm or more is being soluble. In a broad sense, being soluble includes being slightly soluble. Being insoluble is lowest in solubility, followed by being sparingly soluble and soluble. In a narrow sense, being slightly soluble is lower in solubility than being soluble and higher in solubility than being sparingly soluble.

The previously described ammonia water of 5.0 mass % may be changed to a peeling liquid which is used in a process to be conducted later. A liquid used for evaluating the solubility is not required to be the same as the peeling liquid and may be any liquid in which components different in solubility are present together. (B) first component present in the processing film formed by the processing liquid is started to be dissolved by the peeling liquid, which can serve as the beginning of peeling the processing film from a substrate. Thus, partial dissolution of (B) first component by the peeling liquid can serve as the beginning of peeling the processing film. Therefore, for example, the peeling liquid may be lower in alkalinity than a liquid used for evaluating the solubility.

<First Component>

(B) first component is (B') crack promoting component. (B') crack promoting component contains hydrocarbon and also has a hydroxy group (—OH) and/or a carbonyl group (—C(=O)—). In a case where (B') crack promoting component is a polymer, one type of constituent unit contains hydrocarbon for each unit and also has a hydroxy group and/or a carbonyl group. As the carbonyl group, carboxylic acid (—COOH), aldehyde, ketone, ester, amid and enone, etc., can be cited, and carboxylic acid is preferable.

It is considered that when the processing liquid is dried to form a processing film on a substrate and the peeling liquid peels the processing film, (B) first component produces a portion which serves as the beginning of peeling the processing film, which is, however, free of any intention of restricting the scope of claims or not constrained by any theory. It is, thus, preferable that (B) first component is higher in solubility in the peeling liquid than (A) second component. As a mode in which (B') crack promoting component contains ketone as a carbonyl group, cyclic hydrocarbon can be cited. As specific examples, 1, 2-cyclohexanedione and 1, 3-cyclohexanedione can be cited.

As a more specific mode, (B) first component is expressed at least by any one of (B-1), (B-2) and (B-3) given below. (B-1) contains 1 to 6 (preferably 1 to 4) of constituent units expressed by Chemical Formula 14 given below and is a compound in which each of the constituent units is bonded by a linking group $L_1$.

[Chemical Formula 14]

Here, $L_1$ is selected at least from a single bond and any one of $C_{1~6}$ alkylene. The $C_{1~6}$ alkylene couples the constituent units as a linker and is not restricted to a group with valency of 2. A group with valency of 2 to 4 is preferable. The $C_{1~6}$ alkylene may be either linear or branched. $L_1$ is preferably a single bond, methylene, ethylene or propylene.

Cy$_1$ is a hydrocarbon ring of C$_{5\sim30}$, preferably phenyl, cyclohexane or naphthyl and more preferably phenyl. As a preferable mode, the linker L$_1$ couples a plurality of Cy$_1$.

R$_1$ is each independently C$_{1\sim5}$ alkyl and preferably methyl, ethyl, propyl or butyl. The C$_{1\sim5}$ alkyl may be either linear or branched.

n$_{b1}$ is 1, 2 or 3 and preferably 1 or 2 and more preferably 1. n$_{b1'}$ is 0, 1, 2, 3 or 4 and preferably 0, 1 or 2.

As preferable examples of (B-1), 2,2-bis(4-hydroxyphenyl) propane, 2,2'-methylenebis(4-methylphenol), 2,6-bis [(2-hydroxy-5-methylphenyl)methyl]-4-methylphenol, 1,3-cyclohexanediol, 4,4'-dihydroxybiphenyl, 2,6-naphthalenediol, 2,5-di-tert-butylhydroquinone, and 1,1,2,2-tetrakis (4-hydroxyphenyl) ethane can be cited, which is, however, free of any intention of restricting the scope of claims. They may be obtained by polymerization or condensation.

2,6-bis[(2-hydroxy-5-methylphenyl) methyl]-4-methylphenol shown in Chemical Formula 15 will be described as one example. This compound has three constituent units expressed by Chemical Formula 14 at (B-1) and the constituent unit is coupled by L$_1$(methylene). n$_{b1}$ is equal to n$_{b1'}$ which is equal to 1, and R$_1$ is methyl.

[Chemical Formula 15]

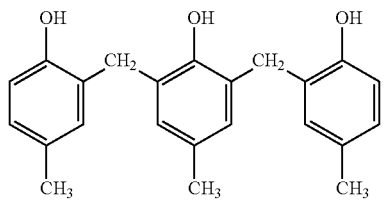

(B-2) is expressed by Chemical Formula 16 given below.

[Chemical Formula 16]

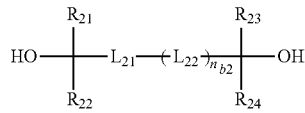

R$_{21}$, R$_{22}$, R$_{23}$ and R$_{24}$ are each independently hydrogen or C$_{1\sim5}$ alkyl, preferably hydrogen, methyl, ethyl, t-butyl or isopropyl, more preferably hydrogen, methyl or ethyl, and further preferably methyl or ethyl.

L$_{21}$ and L$_{22}$ are each independently C$_{1\sim20}$ alkylene, C$_{1\sim20}$ cycloalkylene, C$_{2\sim4}$ alkenylene, C$_{2\sim4}$ alkynylene or C$_{6\sim20}$ arylene. These groups may be substituted by C$_{1\sim5}$ alkyl or hydroxyl. Here, alkenylene indicates hydrocarbon with valency of 2 having one or more double bond, and alkynylene indicates hydrocarbon group with valency of 2 having one or more triple bond. L$_{21}$ and L$_{22}$ are preferably C$_{2\sim4}$ alkylene, acetylene (C$_2$ alkynylene) or phenylene, more preferably C$_{2\sim4}$ alkylene or acetylene and further preferably acetylene.

n$_{b2}$ is 0, 1 or 2, preferably 0 or 1 and more preferably 0.

As preferable examples of (B-2), 3,6-dimethyl-4-octene-3,6-diol, 2,5-dimethyl-3-hexene-2,5-diol can be cited, which is, however, free of any intention of restricting the scope of claims. In the other mode, as preferable examples of (B-2), 3-hexene-2,5-diol, 1,4-butenediol, 2,4-hexadiyne-1,6-diol, 1,4-butanediol, cis-1,4-dihydroxy 2-butene, and 1,4-benzenedimethanol can be cited.

(B-3) is a polymer which contains a constituent unit expressed by Chemical Formula 17 given below and has the weight average molecular weight (Mw) of 500 to 10,000. Mw is preferably 600 to 5,000 and more preferably 700 to 3,000.

[Chemical Formula 17]

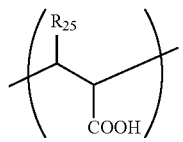

Here, R$_{25}$ is —H —CH$_3$ or —COOH, preferably —H or —COOH. It is also permissible that one (B-3) polymer each contains two or more types of constituent units expressed by Chemical Formula 14.

As preferable examples of (B-3) polymer, acrylic acid, maleic acid, acrylic acid and a polymer of a combination thereof can be cited, which is, however, free of any intention of restricting the scope of claims. Polyacrylic acid and a maleic acid/acrylic acid copolymer are more preferable examples.

In the case of copolymerization, random copolymerization or block copolymerization is preferable, and random copolymerization is more preferable.

The maleic acid/acrylic acid copolymer shown in Chemical Formula 18 will be described as an example. The copolymer is contained in (B-3) and has two types of constituent units expressed by Chemical Formula 14. In one constituent unit, R$_{25}$ is —H, and in the other constituent unit, R$_{25}$ is —COOH.

[Chemical Formula 18]

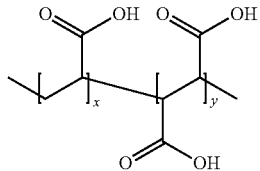

As a matter of course, the processing liquid may contain a combination of one or two or more of the above-described preferable examples as (B) first component. For example, (B) first component may contain both of 2,2-bis(4-hydroxyphenyl) propane and 3,6-dimethyl-4-octene-3,6-diol.

(B) first component may be 80 to 10,000 in molecular weight. The first component is preferably 90 to 50000 in molecular weight and more preferably 100 to 3000. In a case where (B) first component is a resin or a polymer, the molecular weight is expressed in terms of weight average molecular weight (Mw).

(B) first component is available by synthesis or purchase. A supplier includes Sigma-Aldrich, Tokyo Chemical Industry Co., Ltd., and Nippon Shokubai Co., Ltd.

(B) first component is contained preferably at 1 to 100 mass % in the processing liquid and more preferably at 1 to 50 mass %, as compared with the mass of (A) second component. (B) first component is contained further preferably at 1 to 30 mass % in the processing liquid, as compared with the mass of (A) second component.

<Solvent>

It is preferable that (C) solvent contains an organic solvent. (C) solvent may have volatility. Having volatility means that it is higher in volatility than water. For example, (C) solvent has preferably a boiling point of 50 to 250° C. at one atmosphere pressure. The solvent has more preferably 50 to 200° C. at one atmosphere pressure and has further preferably a boiling point of 60 to 170° C. The solvent has even further preferably a boiling point of 70 to 150° C. at one atmosphere pressure. It is permissible that (C) solvent contains a small quantity of pure water. Pure water is contained preferably at 30 mass % or less in (C) solvent, as compared with an entirety of (C) solvent. Pure water is contained more preferably at 20 mass % or less in the solvent and further preferably at 10 mass % or less. Pure water is contained even further preferably at 5 mass % or less in the solvent. That the solvent is free of pure water (0 mass %) is also one preferable mode. Pure water is preferably DIW.

As the organic solvent, alcohols such as isopropanol (IPA), etc.; ethylene glycol monoalkyl ethers such as ethylene glycol monomethyl ether, ethylene glycol monoethylether, etc.; ethylene glycol monoalkyl ether acetates such as ethylene glycol monomethyl ether acetate, ethylene glycol monoethyl ether acetate, etc.; propylene glycol monoalkyl ethers such as propylene glycol monomethyl ether (PGME), propylene glycol monoethyl ether (PGEE), etc.; propylene glycol monoalkyl ether acetates such as propylene glycol monomethyl ether acetate (PGMEA), propylene glycol monoethyl ether acetate, etc.; lactic acid esters such as methyl lactate, ethyl lactate (EL), etc.; aromatic hydrocarbons such as toluene, xylene, etc.; ketones such as methyl ethyl ketone, 2-heptanone, cyclohexanone etc.; amides such as N,N-dimethylacetoamide, N-methylpyrrolidone, etc.; and lactones such as γ-butyrolactone, etc., can be cited. These organic solvents can be used solely or two or more of them can be used by being mixed.

As one preferable mode, the organic solvent contained by (C) solvent is selected from IPA, PGME, PGEE, EL, PGMEA and any combination of them. Where the organic solvent is a combination of two types of components, a volume ratio thereof is preferably 20:80 to 80:20 and more preferably 30:70 to 70:30.

As compared with an entire mass of the processing liquid, (C) solvent is 0.1 to 99.9 mass %. As compared with an entire mass of the processing liquid, (C) solvent is preferably 50 to 99.9 mass % and more preferably 75 to 99.5 mass %. As compared with an entire mass of the processing liquid, (C) solvent is further preferably 80 to 99 mass % and even further preferably 85 to 99 mass %.

<Other Additive>

The processing liquid of the present invention may further contain (D) other additives. As one mode of the present invention, (D) another additive contains surfactant, acid, base, antibacterial agent, bactericide, antiseptic, or antifungal agent (preferably surfactant). It may contain any one of these combinations.

As one mode of the present invention, as compared with a mass of (A) second component in the processing liquid, (D) other additive (a sum in the case of plural other additives) is 0 to 100 mass % (preferably 0 to 10 mass %, more preferably 0 to 5 mass %, further preferably 0 to 3 mass % and even further preferably 0 to 1 mass %). That the processing liquid contains no (D) other additive (0 mass %) is also one mode of the present invention.

<Peeling Liquid>

As described previously, the processing liquid is dropped on a substrate and dried to remove (C) solvent, so that (A) second component is formed into a film. Thereby, (A) second component remains as a processing film on the substrate together with (B) first component. Thereafter, the processing film (particle holding layer) is removed from the substrate by a removing liquid. The processing film is able to hold particles present on the substrate, and removed by the peeling liquid while holding the particles.

The peeling liquid may be alkaline, neutral or acid, and being alkaline is preferable. The peeling liquid is preferably 7 to 13 in pH. In detail, the peeling liquid is preferably 8 to 13 in pH, more preferably 10 to 13 in pH and further preferably 11 to 12.5 in pH. It is preferable that degassing is conducted on pH measurement in order to avoid influences resulting from dissolution of carbon dioxide in the air.

As specific examples of the peeling liquid, ammonia water, SC-1 cleaning solution, aqueous TMAH solution, aqueous choline solution and any combination of them can be cited (preferably ammonia water), which is, however, free of any intention of restricting the scope of claims. The solvent of the peeling liquid is substantially pure water. A percentage of pure water in relation to the solvent of the peeling liquid is 50 to 100 mass % (preferably 70 to 100 mass %, more preferably 90 to 100 mass %, further preferably 95 to 100 mass % and even further preferably 99 to 100 mass %). Concentrations of the solute of the peeling liquid are 0.1 to 10 mass % (preferably 0.2 to 8 mass %, more preferably 0.3 to 6 mass %). The alkaline component is added to the processing liquid, by which pure water (the concentration of the solute is 0.0 mass % and preferably 0.00 mass %) can be used in the peeling liquid.

Conditions of forming the processing film and conditions of peeling the processing film from a substrate can also be described as follows.

The processing liquid is made up of (A) second component, (B') crack promoting component (first component) and (C) solvent. The processing liquid of the present invention is dropped on a substrate and dried, so that (A) second component is formed into a film. (A) second component is formed into a film to form the processing film. Thereafter, the peeling liquid is supplied to the processing film, so that the crack promoting component is dissolved into the peeling liquid. The crack promoting component is dissolved into the peeling liquid to produce a mark (void hole) resulting from dissolution of the crack promoting component into the processing film. The mark promotes actions of peeling a particle layer from the substrate. A crack is widened, with the mark given as a starting point. The crack is widened, thus making it possible to remove the split processing film from the substrate, in a state where particles is held.

It is considered that when the peeling liquid removes (for example, peels) the processing film, (B) first component remaining on the film produces a portion which serves as the beginning of peeling the processing film. It is, therefore, preferable that (B) first component is higher in solubility in the peeling liquid than (A) second component. The processing film is preferably not completely dissolved by the peeling liquid but removed from the substrate, with particles held. It is considered that the processing film is removed in a state of being finely split, for example, by "the portion which serves as the beginning of peeling the processing film."

The present invention will be described by referring to the following various examples. It is noted that the processing liquid and the peeling liquid shall not be restricted only to these examples.

Provision of Patterned Substrate

A KrF resist composition (AZ DX-6270P, Merck Performance Materials Ltd., which will be hereinafter referred to as MPM) is dropped on an 8-inch Si substrate and spin-coated on the substrate at 1500 rpm. The substrate is soft-baked at 120° C. for 90 seconds. Then, the substrate is exposed at 20 mJ/cm² by using a KrF Stepper (FPA-3000 EX5, Canon) and subjected to PEB (post exposure bake) at 130° C. for 90 seconds and developed by using a developing fluid (AZ MIF-300, MPM). Thereby, a resist pattern, having a pitch 360 nm and a line space with a duty ratio of 1:1, is obtained. The same resist pattern is used as an etching mask to etch the substrate by a drying etching apparatus (NE-5000N, ULVAC). Thereafter, the substrate is cleaned by a stripper (AZ 400T, MPM) to peel the resist pattern and a resist residue. Thereby, a patterned substrate, with a pattern having a pitch, 360 nm; duty ratio, 1:1; and line height, 150 nm, is fabricated.

Provision of Bare Substrate.

An 8-inch Si substrate is used.

Preparation of Evaluation Substrate

Particles are attached to the pattern substrate and the bare substrate described above.

As experimental particles, ultra-high purity colloidal silica (PL-10H, Fuso Chemical Co., Ltd., average primary particle diameter: 90 nm) is used. A silica microparticle composition is dropped in a quantity of 50 mL and rotated at 500 rpm for 5 seconds to effect coating. Thereafter, the composition is rotated at 1000 rpm for 30 seconds to spin-dry a solvent of the silica microparticle composition. Thereby, an evaluation substrate is obtained.

Evaluation of Solubility

Each component to be used subsequently (for example, 2,2-bis(4-hydroxyphenyl) propane), 4 mg, is placed into a 50 mL-sample bottle, and 5.0 mass % ammonia water is added thereto to give a total quantity of 40 g. The bottle is capped, and shaken and agitated for 3 hours. Thereby, a solution with component concentration of 100 ppm is obtained. Similar procedures except that an added quantity of each component is changed to 40 mg are conducted to obtain a solution of 1,000 ppm.

The solubility of each of the components is visually confirmed. Evaluation criteria are as follows.

X: At component concentrations of 100 ppm and 1,000 ppm, a dissolved residue of the component concerned is confirmed. In this case, the component is judged to be insoluble or sparingly soluble.

Y: At a component concentration of 100 ppm, no dissolved residue is confirmed and at 1,000 ppm, a dissolved residue is confirmed. In this case, the component is judged to be slightly soluble.

Z: At component concentrations of 100 ppm and 1,000 ppm, no dissolved residue is confirmed. In this case, the component is judged to be soluble.

Evaluation results are filled in Table 1 to Table 4.

Preparation Example 1 of Cleaning Liquid 1

As (A) second component, novolac (Mw approximately 300) is used, and as (B) first component, 2,2-bis(4-hydroxyphenyl) propane is used.

2,2-bis(4-hydroxyphenyl) propane is weighed so as to give 5 mass % in relation to novolac (Mw approximately 300). They are taken so as to give a total quantity of 5 g and added to 95 g IPA ((C) solvent). The resultant is agitated for one hour by using a stirrer to obtain a solution having a solid component concentration of 5 mass %.

The thus obtained solution is filtered by Optimizer UPE (Entegris Japan, Inc. UPE, bore diameter, 10 nm). Thereby, a cleaning liquid 1 is obtained. The results are filled in Table 1.

In Table 1 to Table 4 given below, the number in the parentheses on (B) column means a concentration (mass %) of (B) first component in comparison with (A) second component.

TABLE 1

| | (A) | | (B) | | | Solid component concentration | Removal evaluation | |
|---|---|---|---|---|---|---|---|---|
| | Component | Solubility | Component | Solubility | (C) | | Patterned substrate | Bare substrate |
| Cleaning liquid 1 | A1 | X | B1 (5%) | Y | IPA | 5% | A | A |
| Cleaning liquid 2 | A2 | X | B1 (5%) | Y | IPA | 5% | AA | A |
| Cleaning liquid 3 | A3 | X | B1 (5%) | Y | IPA | 5% | AA | AA |
| Cleaning liquid 4 | A4 | X | B1 (5%) | Y | IPA | 5% | AA | AA |
| Cleaning liquid 5 | A5 | X | B1 (5%) | Y | IPA | 5% | A | AA |
| Cleaning liquid 6 | A6 | X | B1 (1%) | Y | IPA | 5% | A | A |
| Cleaning liquid 7 | A7 | X | B1 (5%) | Y | PGME | 5% | AA | AA |
| Cleaning liquid 8 | A8 | X | B1 (5%) | Y | PGME | 5% | AA | AA |
| Cleaning liquid 9 | A9 | X | B1 (5%) | Y | PGME | 5% | AA | AA |
| Cleaning liquid 10 | A10 | X | B1 (5%) | Y | PGME | 5% | AA | AA |
| Cleaning liquid 11 | A11 | X | B1 (5%) | Y | PGME | 5% | AA | AA |

TABLE 2

| | (A) | | (B) | | | Solid component | Removal evaluation | |
| | Component | Solubility | Component | Solubility | (C) | concentration | Patterned substrate | Bare substrate |
|---|---|---|---|---|---|---|---|---|
| Cleaning liquid 12 | A12 | X | B1 (0.10%) | Y | IPA:PGME = 1:1 | 5% | A | A |
| Cleaning liquid 13 | A12 | X | B1 (1%) | Y | IPA:PGME = 1:1 | 5% | AA | AA |
| Cleaning liquid 14 | A12 | X | B1 (5%) | Y | IPA:PGME = 1:1 | 5% | AA | AA |
| Cleaning liquid 15 | A12 | X | B1 (10%) | Y | IPA:PGME = 1:1 | 5% | AA | AA |
| Cleaning liquid 16 | A12 | X | B1 (50%) | Y | IPA:PGME = 1:1 | 5% | AA | AA |
| Cleaning liquid 17 | A12 | X | B1 (100%) | Y | IPA:PGME = 1:1 | 5% | A | A |
| Cleaning liquid 18 | A12 | X | B1 (5%) | Y | IPA:PGEE = 1:1 | 0.10% | A | A |
| Cleaning liquid 19 | A12 | X | B1 (5%) | Y | IPA:PGEE = 1:1 | 1% | AA | A |
| Cleaning liquid 20 | A12 | X | B1 (5%) | Y | IPA:PGEE = 1:1 | 10% | AA | AA |
| Cleaning liquid 21 | A12 | X | B1 (5%) | Y | IPA:PGEE = 1:1 | 30% | AA | A |
| Cleaning liquid 22 | A12 | X | B1 (5%) | Y | IPA:PGEE = 1:1 | 50% | AA | A |

TABLE 3

| | (A) | | (B) | | | Solid component | Removal evaluation | |
| | Component | Solubility | Component | Solubility | (C) | concentration | Patterned substrate | Bare substrate |
|---|---|---|---|---|---|---|---|---|
| Cleaning liquid 23 | A12 | X | B2 (5%) | Z | PGEE | 5% | A | AA |
| Cleaning liquid 24 | A12 | X | B3 (5%) | Z | PGEE | 5% | A | AA |
| Cleaning liquid 25 | A12 | X | B4 (5%) | Y | PGEE | 5% | AA | AA |
| Cleaning liquid 26 | A12 | X | B5 (5%) | Z | PGEE | 5% | AA | AA |
| Cleaning liquid 27 | A12 | X | B6 (5%) | Y | PGEE | 5% | AA | AA |
| Cleaning liquid 28 | A12 | X | B7 (5%) | Y | EL | 5% | AA | AA |
| Cleaning liquid 29 | A12 | X | B8 (5%) | Z | EL | 5% | AA | AA |
| Cleaning liquid 30 | A12 | X | B9 (5%) | Z | EL | 5% | AA | AA |
| Cleaning liquid 31 | A12 | X | B10 (5%) | Z | EL | 5% | AA | AA |
| Cleaning liquid 32 | A12 | X | B11 (5%) | Z | IPA:DIW = 1:2 | 5% | AA | A |
| Cleaning liquid 33 | A12 | X | B12 (5%) | Z | IPA:DIW = 1:2 | 5% | AA | A |

TABLE 4

| | (A) | | (B) | | (C) | Solid component concentration | Removal evaluation | |
|---|---|---|---|---|---|---|---|---|
| | Component | Solubility | Component | Solubility | | | Patterned substrate | Bare substrate |
| Comparison cleaning liquid 1 | A12 | X | — | — | IPA | 5% | B | D |
| Comparison cleaning liquid 2 | — | — | B4 | Y | IPA | 5% | C | C |
| Comparison cleaning liquid 3 | A12 | X | B13 (5%) | X | IPA | 5% | D | D |
| Comparison cleaning liquid 4 | A13 | Z | B11 (5%) | Z | IPA:DIW = 1:2 | 5% | B | B |
| Comparison cleaning liquid 5 | A14 | Z | B11 (5%) | Z | IPA:DIW = 1:2 | 5% | C | C |
| Comparison cleaning liquid 6 | A15 | Z | B3 (5%) | Z | IPA:DIW = 1:2 | 5% | C | C |
| Comparison cleaning liquid 7 | A16 | Z | B3 (5%) | Z | IPA:DIW = 1:2 | 5% | C | C |

In the above tables, the following abbreviation is made.
Novolac (Mw approximately 300) is abbreviated as A1,
Novolac (Mw approximately 500), as A2,
Novolac (Mw approximately 1,000), as A3,
Novolac (Mw approximately 10,000), as A4,
Novolac (Mw approximately 100,000), as A5,
Novolac (Mw approximately 500,000), as A6,
Phenol novolac (Mw approximately 5,000), as A7,
Polyhydroxystyrene (Mw approximately 5,000), as A8,
Polyacrylic acid butyl having a structure shown in Chemical Formula 19 given below (Mw approximately 60,000, Sigma-Aldrich), as A9,

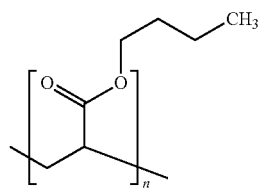

[Chemical Formula 19]

Polycarbonate (Mw approximately 5,000), as A10,
4,4'-dihydroxytetraphenylmethane (Mw352), as A11,
Novolac (Mw approximately 5,000), as A12,
Polyfluoroalkyl acid (TAR-015, Daikin Industries Ltd.), as A13,
KF-351A (silicon-containing polyester modified polymer, Shin-Etsu Chemical Co., Ltd.), as A14,
Polyvinylimidazole (Mw approximately 5,000), as A15,
Polyallylamine (Mw approximately 5,000), as A16,
2,2-bis(4-hydroxyphenyl) propane, as B1,
1,1,2,2-tetrakis (4-hydroxyphenyl) ethane, as B2,
1,3-cyclohexanediol, as B3,
2,6-bis[(2-hydroxy-5-methylphenyl)methyl]-4-methylphenol, as B4,
2,2'-methylenebis(4-methylphenol), as B5,
4,4'-dihydroxybiphenyl, as B6,
2,6-naphthalenediol, as B7,
2,5-dimethyl-3-hexene-2,5-diol, as B8,
3,6-dimethyl-4-octene-3,6-diol, as B9,
2,5-di-tert-butylhydroquinone, as B10,
Polyacrylic acid (Mw approximately 1,000), as B11,
Maleic acid/acrylic acid copolymer (Mw approximately 3,000) having a structure shown in Chemical Formula 20 given below, as B12,

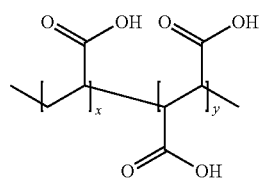

[Chemical Formula 20]

Novolac (Mw approximately 15,000), as B13.

Comparison Preparation Example 1 of Comparison Cleaning Liquid 1

Preparation is done in the same manner as the preparation example 1 except that A12 is taken in a quantity of 5 g and added to 95 g IPA ((C) solvent) to obtain a comparison cleaning liquid 1. The results are filled in Table 4.

Comparison Preparation Example 2 of Comparison Cleaning Liquid 2

Preparation is done in the same manner as the preparation example 1 except that B4 is taken in a quantity of 5 g and added to 95 g IPA ((C) solvent) to obtain a comparison cleaning liquid 2. The results are filled in Table 4.

Preparation Examples 2 to 33 of Cleaning Liquids 2 to 33 and Comparison Preparation Examples 3 to 7 of Comparison Cleaning Liquids 3 to 7

Cleaning liquids 2 to 33 and comparison cleaning liquids 3 to 7 are prepared in the same manner as the preparation example 1, except that (A) second component, (B) first component, (C) solvent and concentrations are changed to those described in Table 1 to Table 4. The results are filled in Table 1 to Table 4.

Evaluation of Residual Particle Amounts in Cleaning Liquids 1 to 33 and Comparison Cleaning Liquids 1 to 7

An evaluation substrate is used which is prepared as described in the preparation of the above-described evaluation substrate.

Each processing liquid is dropped on each evaluation substrate in a quantity of 10 cc by using a Coater-Developer RF3 (SOKUDO Ltd.) and rotated at 1,500 rpm for 60 seconds, thereby effecting coating and drying. While the substrate is rotated at 100 rpm, 5.0 mass % ammonia water is dropped for 10 seconds to cover an entirety of the substrate with 5.0 mass % ammonia water. This state is kept for 20 seconds. The substrate is rotated at 1,500 rpm to peel and remove a film, and the substrate is dried.

Residual particle amounts of these substrates are compared. A bright field defect inspection apparatus (U Vision 4, AMAT Ltd.) is used in evaluating the pattern substrate, and a dark field defect inspection apparatus (LS-9110, Hitachi High-Technologies Corporation) is used in evaluating the bare substrate.

Coating situations and film removing situations are confirmed to count remaining numbers of particles. An evaluation is made by referring to the following criteria to fill the evaluation results in Table 1 to Table 4.

AA: ≤10 particles
A: >10 particles, ≤100 particles
B: >100 particles, ≤1,000 particles
C: >1000 particles
D: No film is uniformly coated or removed.

The comparison cleaning liquids 1 to 7 are free of a plurality of components different in degree of solubility. As compared with the comparison cleaning liquids 1 to 7, substrates cleaned with the cleaning liquids 1 to 33 are confirmed to be smaller in residual particle amount.

In the present Specification, unless restrictedly mentioned otherwise, the singular form includes the plural form and signifies "one of," "the," and "at least one of" Unless mentioned otherwise, an element of a concept is capable of being expressed in a plurality of types and when an amount (for example, mass % or mole %) thereof is indicated, the amount signifies the sum of the plurality of types.

"And/or" includes all combinations of the elements and includes use of each singular element.

In the present Specification, when a numerical range is indicated using "to", "~" or "-." unless restrictedly mentioned otherwise, both endpoints are included and the units are the same. For example, 5 to 25 mole % signifies not less than 5 mole % and not more than 25 mole %.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A substrate processing method comprising:
    a processing liquid supplying step of supplying a processing liquid to a patterned surface of a substrate, the patterned surface having projections and recesses;
    a processing film forming step of solidifying or curing the processing liquid supplied to the patterned surface to form a processing film which holds a removal object present on the patterned surface, the processing film forming step including a step of forming the processing film such that, in an interior of a recessed portion defined between an adjacent pair of the projections of the patterned surface, the front surface of the processing film is positioned closer to a bottom of the recessed portion than top ends of the adjacent pair of the projected portions defining the recessed portion;
    a removing step of supplying a peeling liquid to the patterned surface to peel the processing film from the patterned surface together with the removal object, thereby removing the processing film from the substrate, while such a state is kept that the removal object is held by the processing film; and
    a substrate rotating step of holding the substrate horizontally to rotate the substrate around a vertical axis passing through a central portion of the substrate,
    wherein the substrate rotating step includes a first rotating step of rotating the substrate at a first speed until formation of the processing film from a start of supplying the processing liquid to the patterned surface, thereby causing the processing liquid to enter the recesses of the pattern surface, and a second rotating step of accelerating a rotation of the substrate to rotate the substrate at a second speed faster than the first speed after the first rotating step, thereby forming a semi-solid state film from the processing liquid on the substrate, and
    the method further comprises a heating step of heating the semi-solid state film that is started after the semi-solid state film has been formed and that is performed until the processing film is formed, and
    the semi-solid state film before start of the heating step has a front surface positioned closer to the bottom of the recessed portion than the top ends of the adjacent pair of the projected portions defining the recessed portion in the interior of the recessed portion defined between the adjacent pair of the projections of the patterned surface.

2. The substrate processing method according to claim 1, wherein, in the first rotating step, the processing liquid enters into the recesses of the pattern surface due to its own weight, and
    the processing liquid, which is thinned, is formed by eliminating the processing liquid from the patterned surface in the second rotating step in a state where the processing liquid has entered into the recesses of the pattern surface due to its own weight.

3. The substrate processing method according to claim 1, wherein the processing film forming step includes a step of forming the processing film such that a film thickness of the processing film becomes thinner than a height of the projections and the recesses of the patterned surface in a thickness direction of the substrate.

4. The substrate processing method according to claim 1, wherein the processing film forming step includes a step of forming the processing film such that the processing film covers the removal object.

5. The substrate processing method according to claim 1, wherein the processing film forming step includes a step of forming the processing film such that an adhesion of the processing film to the removal object becomes greater than an adhesion of the removal object to the patterned surface.

6. The substrate processing method according to claim 1, wherein the removing step includes a penetrating hole forming step of partially dissolving the processing film by the peeling liquid to form a penetrating hole on the processing film.

7. The substrate processing method according to claim 6, wherein the removing step includes a peeling liquid entry step of entering the peeling liquid between the processing film and the patterned surface via the penetrating hole.

8. The substrate processing method according to claim 1, wherein the heating step includes a heating medium supplying step of supplying a heating medium to a lower surface of the substrate while rotating the substrate, and a rotating speed of the substrate in the heating medium supplying step is equal to or lower than the rotation speed of the substrate in the second rotation step.

9. The substrate processing method according to claim 1, wherein the processing liquid has a solute having a first component and a second component lower in solubility in the peeling liquid than the first component and a solvent which dissolves the solute, and the processing film forming step includes a step of forming the processing film which has a first solid formed by the first component and a second solid formed by the second component.

10. The substrate processing method according to claim 9, wherein the second component contains at least any one of novolac, polyhydroxystyrene, polystyrene, a polyacrylic acid derivative, a polymaleic acid derivative, polycarbonate, a polyvinyl alcohol derivative, a polmethacrylic acid derivative and a copolymer of a combination thereof.

11. The substrate processing method according to claim 9, wherein the first component is a crack promoting component, and the crack promoting component contains hydrocarbon, and a hydroxy group and/or a carbonyl group.

12. The substrate processing method according to claim 9, wherein the first component is expressed by at least any one of (B-1), (B-2) and (B-3) given below;

(B-1) is a compound which contains 1 to 6 of constituent units expressed by Chemical Formula 1 and in which each of the constituent units is bonded by a linking group $L_1$,

[Chemical Formula 1]

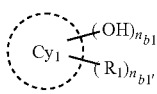

here, $L_1$ is selected at least from a single bond and any one of $C_{1-6}$ alkylene, $Cy_1$ is a hydrocarbon ring of $C_{5-30}$, $R_1$ is each independently $C_{1-5}$ alkyl, $n_{b1}$ is 1, 2 or 3, and $n_{b1'}$ is 0, 1, 2, 3 or 4;

(B-2) is a compound expressed by Chemical Formula 2,

[Chemical Formula 2]

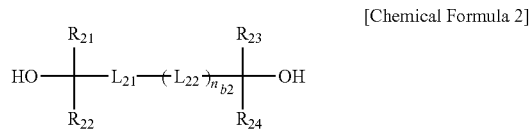

here, $R_{21}$, $R_{22}$, $R_{23}$ and $R_{24}$ are each independently hydrogen or $C_{1-5}$ alkyl, $L_{21}$ and $L_{22}$ are each independently $C_{1-20}$ alkylene, $C_{1-20}$ cycloalkylene, $C_{2-4}$ alkenylene, $C_{2-4}$ alkynylene or $C_{6-20}$ arylene, these groups may be substituted by $C_{1-5}$ alkyl or hydroxyl, and $n_{b2}$ is 0, 1 or 2;

(B-3) is a polymer which contains a constituent unit expressed by Chemical Formula 3 and has a weight average molecular weight (Mw) of 500 to 10,000,

[Chemical Formula 3]

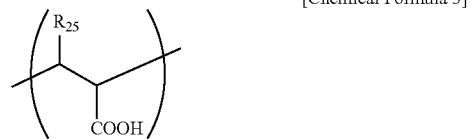

$R_{25}$ is —H —$CH_3$ or —COOH.

13. The substrate processing method according to claim 9, wherein the solubility of the second component in 5.0 mass % ammonia water is less than 100 ppm and the solubility of the first component in 5.0 mass % ammonia water is 100 ppm or more.

14. The substrate processing method according to claim 9, wherein a mass of the second component is 0.1 to 50 mass %, as compared with an entire mass of the processing liquid.

15. The substrate processing method according to claim 9, wherein a weight average molecular weight (Mw) of the second component is 150 to 500,000.

* * * * *